(12) United States Patent
Suda

(10) Patent No.: US 7,110,034 B2
(45) Date of Patent: *Sep. 19, 2006

(54) IMAGE PICKUP APPARATUS CONTAINING LIGHT ADJUSTMENT PORTION WITH REFLECTION OF A PORTION OF LIGHT ONTO ADJACENT PIXELS

(75) Inventor: Yasuo Suda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 665 days.

This patent is subject to a terminal disclaimer.

(21) Appl. No.: 10/227,385

(22) Filed: Aug. 26, 2002

(65) Prior Publication Data

US 2003/0063204 A1   Apr. 3, 2003

(30) Foreign Application Priority Data

Aug. 31, 2001   (JP)   ............................. 2001-264128

(51) Int. Cl.
*H04N 5/225* (2006.01)
*H04N 9/07* (2006.01)
*H01L 31/062* (2006.01)
*H01L 31/113* (2006.01)
*H01L 31/0232* (2006.01)

(52) U.S. Cl. .................. 348/340; 348/336; 257/294; 257/436

(58) Field of Classification Search ............... 348/275, 348/276, 335, 336, 340; 257/294, 432, 435, 257/436; 438/69
See application file for complete search history.

(56) References Cited

U.S. PATENT DOCUMENTS

| | | | |
|---|---|---|---|
| 4,415,924 A | 11/1983 | Kawabata et al. | 358/50 |
| 4,929,994 A | 5/1990 | Matsumoto | 357/30 |
| 5,262,819 A | 11/1993 | Ohtaka et al. | 354/402 |
| 6,078,429 A * | 6/2000 | Lyon | 359/634 |
| 6,590,270 B1 * | 7/2003 | Suzuki | 257/436 |

FOREIGN PATENT DOCUMENTS

| | | |
|---|---|---|
| EP | 1 067 779 | 1/2001 |
| JP | 63-269567 | 11/1988 |
| JP | 1-14749 | 3/1989 |
| JP | 8-182006 | 7/1996 |
| JP | 9-219505 | 8/1997 |
| JP | 2000-009955 | 1/2000 |
| JP | 2000-66141 | 3/2000 |
| JP | 2000-184386 | 6/2000 |
| JP | 2000-232258 | 8/2000 |
| JP | 2001-78213 | 3/2001 |

OTHER PUBLICATIONS

Kosaka, et al., "Superprism phenomena in photonic crystals", Physical Review B, vol. 58, No. 16, pp. R10-96 to R10-97 (Oct. 15, 1998).

* cited by examiner

*Primary Examiner*—Ngoc-Yen Vu
*Assistant Examiner*—Daniel Pasiewicz
(74) *Attorney, Agent, or Firm*—Fitzpatrick, Cella, Harper & Scinto

(57) ABSTRACT

An image pickup apparatus comprises a plurality of photoelectric conversion areas, and a light adjustment area including a first transmission portion for transmitting light which is provided in association with a first photoelectric conversion area included in the plurality of photoelectric conversion areas and a second transmission portion for transmitting light which is provided in association with a second photoelectric conversion area included in the plurality of photoelectric conversion areas. The light adjustment area is configured to cause a part of light incident on the second transmission portion to be incident on the first transmission portion.

7 Claims, 19 Drawing Sheets

IMAGE PICKUP APPARATUS CONTAINING LIGHT ADJUSTMENT PORTION WITH REFLECTION OF A PORTION OF LIGHT ONTO ADJACENT PIXELS

BACKGROUND OF THE INVENTION

1. Field of the Invention

The present invention relates to an image pickup apparatus for picking up an object image.

2. Related Background Art

Conventionally, in forming a color image, an image pickup technique is widely used which picks up an object image by a single image pickup element in which pixels each provided with any one of primary color filters of red (R), green (G) and blue (B) are arranged in mosaic and generates luminance information and color information corresponding to the number of pixels by subsequent signal processing. In many cases, a color filter array of the image pickup element used in this technique is the Bayer array. This image pickup technique can realize significant cost reduction without degrading quality of an image so much compared with an image pickup method of a three plate system that separates an object image into R, G and B in advance using a beam splitter for color separation and picking up an image by image pickup elements prepared for respective colors.

However, the above-mentioned conventional technique has the following problems. In general, image pickup for obtaining good image characteristics is composed of a first process for forming an object image by an optical device, a second process for adjusting a high frequency component of a spatial frequency characteristic of the object image to be suppressed, a third process for photoelectrically converting the object image with the spatial frequency characteristic adjusted, and a fourth process for correcting a response to an obtained electric signal according to a spatial frequency. In this image pickup, since sampling of an optical image is performed by an image pickup element with a limited number of pixels, it is necessary to reduce components equal to or greater than the Nyquist frequency peculiar to the image pickup element in spatial frequency characteristics of the optical image. Here, the Nyquist frequency means a frequency that is a half of a sampling frequency depending on a pixel pitch. Therefore, the optimized series of processes adjusts an optical image subjected to sampling to be an optical image of characteristics corresponding to the Nyquist frequency peculiar to the image pickup element, thereby obtaining a high quality image in which aliasing distortion is not conspicuous, that is, moiré is not conspicuous.

A Modulation Transfer Function (MTF) that is a spatial frequency transmission characteristic of an image is an evaluation amount with which a characteristic concerning sharpness of a digital still camera, a video camera or the like can be represented well. Specific elements affecting this MTF are a focusing optical system functioning as an optical device, an optical lowpass filter for limiting a band of an object image, an opening shape of an photoelectrical conversion area of an image pickup element, digital aperture correction and the like. An overall MTF representing final image characteristics is given as a product of MTF of each element. That is, it is sufficient to find MTFs for the above-mentioned first to fourth processes, respectively, and calculate a product of the MTFs. However, since digital filtering that is the fourth process is applied to an image output that has already been subjected to sampling by the image pickup element, it is unnecessary to take into account a high frequency wave exceeding the Nyquist frequency.

Therefore, a configuration for reducing components equal to or greater than the Nyquist frequency peculiar to an image pickup element in spatial frequency characteristics of an optical image means a configuration in which components equal to or greater than the Nyquist frequency are few in a product of the MTF of the first process, the MTF of the second process and the MTF of the third process excluding the fourth process. Here, in the case in which viewing of a still image is considered a premise as in a digital still camera, it is necessary to take into account the fact that an image giving a good feeling of resolution can be easily realized if response in a frequency slightly lower than the Nyquist frequency is higher even if a high frequency wave exceeding the Nyquist frequency is not zero but remains more or less.

In the formation of an object image by the focusing optical system that is the first process, in general, it is easier to correct optical aberration in a center of a screen than in a periphery of the screen. When it is attempted to obtain a good image in the periphery of the screen, it is necessary to obtain extremely good characteristics close to a diffraction limit MTF that depends on an F-number of a focusing lens in the center of the screen. In recent years, this necessity has been increasing as an image pickup element uses smaller pixels. Therefore, it is better to consider an MTF on the assumption that the focusing optical system is an ideal aplanatic lens.

In addition, in an image pickup element in which light receiving openings of a width d are laid without of the light receiving opening is the same as a pixel pitch, a response value of the third process at the Nyquist frequency $u=\frac{1}{2}d$ is rather high. Due to this response, it is a general practice to trap the vicinity of the Nyquist frequency in the second process in order to lower the overall MTF in the vicinity of the Nyquist frequency.

In the second process, an optical lowpass filter is usually used. A material having a birefringence characteristic such as that of quartz is used for the optical lowpass filter. In addition, a diffraction grating of a phase type as disclosed in JP 2000-066141 A may be used. When a birefringent plate is intervened in an optical path of an optical device and the optical axis is slanted to be arranged in parallel with a horizontal direction of a focusing surface, an object image by a normal ray and an object image by an abnormal ray are formed deviating by a predetermined amount in the horizontal direction. Trapping a specific spatial frequency by the birefringent plate means deviating a bright part and a dark part of a stripe of the spatial frequency so as to overlap each other. An MTF by the optical lowpass filter is represented by Expression (1):

$$R2(u)=|\cos(\pi \cdot u \cdot \omega)| \tag{1}$$

where Rs(u) is response, u is a spatial frequency of an optical image and ω is a separation width of an object image.

If a thickness of the birefringent plate is selected appropriately, it is possible to reduce the response to zero in the Nyquist frequency of the image pickup element. If the diffraction grating is used, it is possible to realize the same effect by separating an optical image into a plurality of images of a predetermined positional relationship and superimposing the images by diffraction. However, it is necessary to grow crystal such as quartz or lithium niobate and then grind it to be thin in order to manufacture the birefringent plate. Thus, the birefringent plate becomes very expensive.

In addition, the diffraction grating is also expensive because a highly precise fine structure is required.

On the other hand, JP 2001-078213 A discloses a technique that makes an effective light receiving opening larger than a pixel pitch to suppress an MTF of pixels equal to or greater than the Nyquist frequency by using a compound eye lens although an image pickup system of a single plate type is used. However, since image shift depending on an object distance occurs due to the compound eye, a sampling pitch of an object image becomes unequal in a distance other than a reference object distance. That is, misregistration occurs. Therefore, a predetermined image performance is not always realized regardless of object conditions.

Moreover, as disclosed in JP 01-014749 B (FIG. 5), it is also attempted to suppress response to a high spatial frequency by forming a photoelectrical conversion area of pixels in an intricate shape with respect to neighboring pixels. However, since a shape of the pixels becomes complicated, an extremely fine structure is required. In addition, since each pixel divides a plane, an effect is not easily realized if an object image projected on the pixels has, for example, a slant line along the dividing line. In addition, in each pixel of a color image pickup element, only light transmitted through a predetermined optical filter among an incident light flux is photoelectrically converted, and the light is outputted as an electric signal. Thus, light that could not have been transmitted through the optical filter is disposed of as heat or the like.

FIG. 26 shows an array of photoelectrical conversion areas 901 on an image pickup element. As shown in FIG. 27, a microlens 902 for magnifying area of an opening is provided for each of the photoelectrical conversion areas 901. FIG. 28 is a perspective view of the microlens 902. As shown in the figure, the microlens 902 is a lens having a positive power and has a function of converging received light fluxes to the photoelectrical conversion areas 901 of the image pickup element.

For example, in a CCD image pickup element having pixels with primary color filters arranged in mosaic, which is said to have good color reproducibility, optical filters of red (R), green (G) and blue (B) are arranged one by one between the microlens 902 and the photoelectrical conversion area 901. In this case, in the pixels having the optical filters of R arranged, only red light is photoelectrically converted, and blue light and green light are absorbed by the optical filter and generate heat. In the pixels having the optical filters of G arranged, blue light and red light are not photoelectrically converted but outputted as heat in the same manner. In the pixels having the optical filters of B arranged, green light and red light are not photoelectrically converted but outputted as heat in the same manner. FIG. 25 shows a spectral transmissivity characteristic of the color filters of R, G and B in an image pickup element. Since infrared ray has high transmissivity, infrared ray cut filters for cutting a wavelength of 650 nm or more are additionally used in stack. As is seen from this, only ⅓ of visible light is effectively used in one pixel.

Considering a utilization efficiency for each color of R, G and B more in detail, for example, a ratio of area of R, G and B pixel of a color image pickup element of the Bayer array shown in FIG. 29 is ¼:2/4:¼ when area of a unit constituting a regular array is assumed to be one. Thus, a utilization ratio of green light when an overall amount of light is one is ⅓×2/4=⅙ as a product of a term of wavelength selectivity and a term of an area ratio, those for red light and blue light are ⅓×¼=1/12, respectively. When these are totaled, ⅙+1/12+1/12=⅓. Therefore, the utilization efficiency is still ⅓. To the contrary, when an overall amount of light is assumed to be one, ⅔×2/4=⅓ of green light and ⅔×¼=⅙ of red light and blue light are not effectively utilized among the overall amount of light.

The above description is for the image pickup element using primary color filters. However, ⅓ of visible light is not photoelectrically converted and is not effectively utilized in an image pickup element using complementary color filters. In this way, the conventional image pickup element of the single plate type using either primary color filters or complementary color filters has a bad light utilization efficiency because an image pickup surface is divided by color filters.

On the other hand, JP 08-182006 A discloses a structure of an image pickup element that eliminates such waste of an amount of light. In this image pickup element, a prism is arranged for each spatial pixel, and object light whose color is separated by the prism is received by three color pixels of R, G and B. However, the color pixels have a size approximately ⅓ of the spatial pixels. If it is attempted to make a sensor of a small pixel pitch, an extremely fine structure is required of the color pixels, but there is a limit in making the pixel pitch smaller.

SUMMARY OF THE INVENTION

The present invention has been devised in view of the above and other drawbacks, and it is an object of the present invention to realize an image pickup apparatus that obtains a high grade image with less moiré without requiring an expensive optical lowpass filter.

In addition, it is another object of the present invention to realize an image pickup apparatus in which a utilization efficiency of incident light is increased.

In order to attain the above-mentioned objects, an image pickup apparatus of a first embodiment of the present invention is constituted to have a plurality of light incident portions for causing light to be incident on a plurality of photoelectric conversion areas and an incident light adjustment portion for causing light incident on one of the plurality of light incident portions once to be incident on another adjacent light incident portion.

Then, an image pickup apparatus that obtains a high grade image with less moiré can be realized without requiring an expensive optical lowpass filter. Moreover, an image pickup apparatus in which a utilization efficiency of incident light is increased can be realized.

Other objects and features of the present invention will be apparent from the following descriptions and the accompanying drawings, in which like reference characters designate the same or similar parts throughout the figures thereof.

DESCRIPTION OF THE PREFERRED EMBODIMENTS

Embodiments of the present invention will be hereinafter described with reference to the accompanying drawings.

First Embodiment

Figure 1:
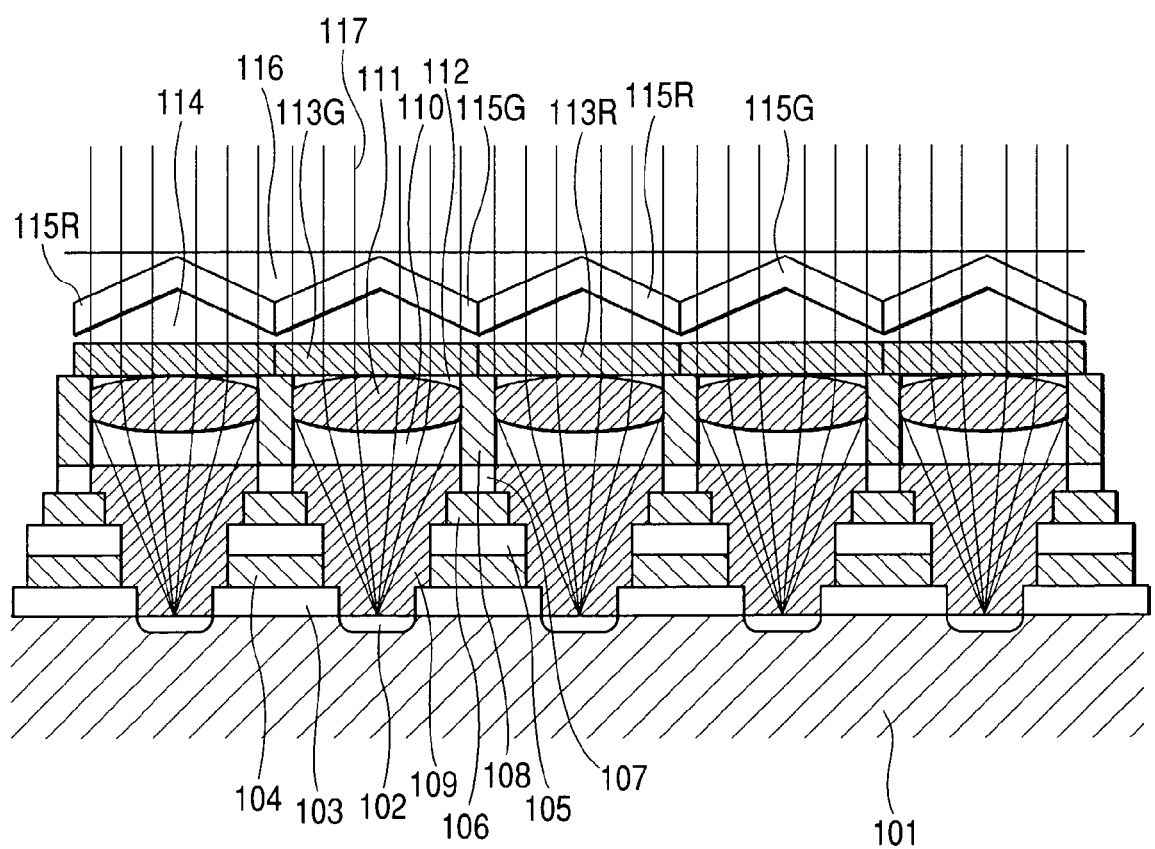
FIG. 1 is a sectional view of an image pickup element.
Figure 2:
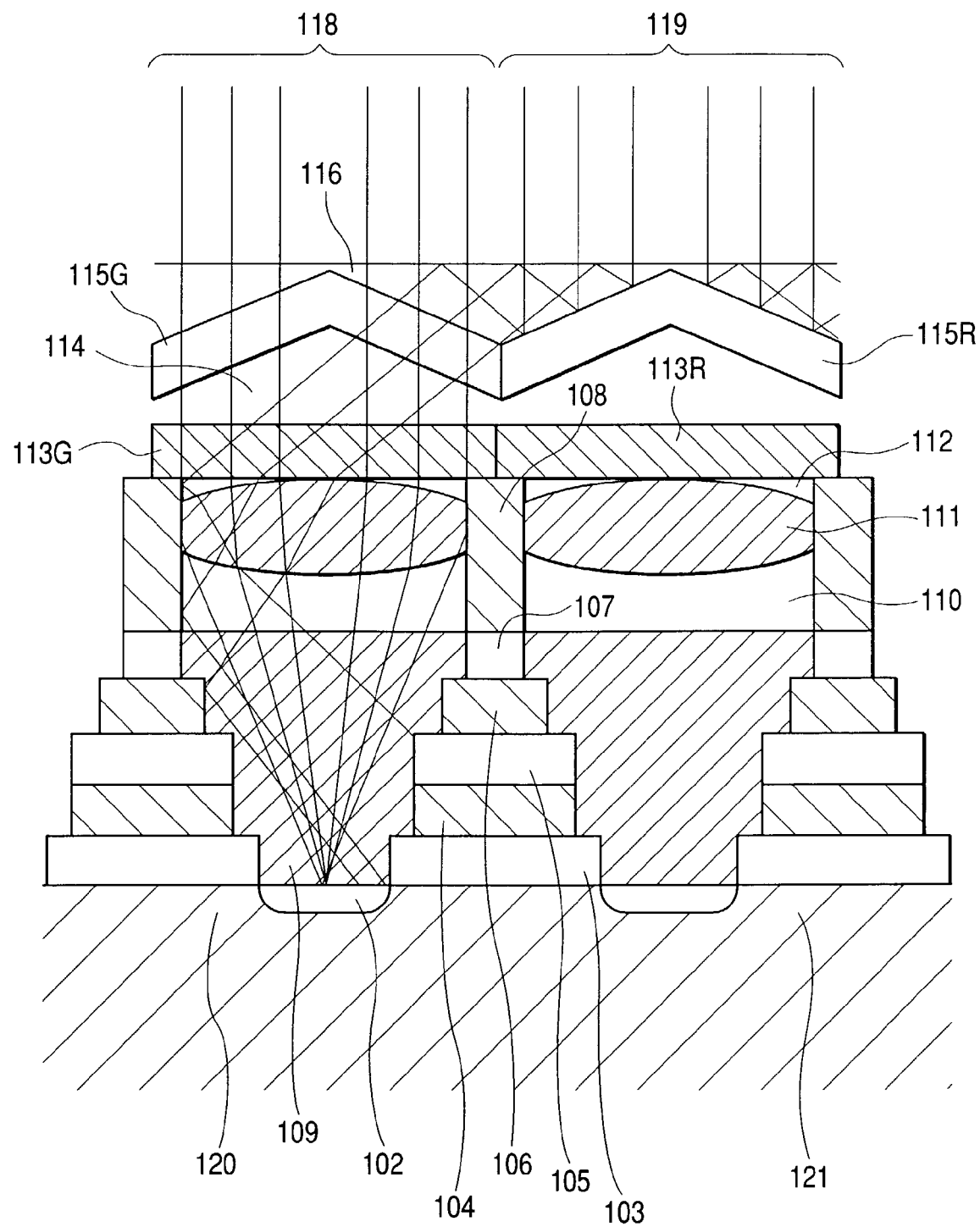
FIG. 2 is a sectional view of the image pickup element.

FIGS. 1 to 14 are views or graphs for explaining a first embodiment in accordance with the present invention. First, FIG. 1 is a sectional view of an image pickup element and FIG. 2 is an enlarged sectional view of the image pickup element. FIGS. 1 and 2 show a state in which object light is incident on a pixel column, in which G pixels and R pixels having different spectral sensitivity characteristics are alternately arranged as in the Bayer array or the like, and reaches photoelectric conversion areas. Note that, in the Bayer array, pixels are regularly arranged with 2×2 R, G, G and B pixels columns as one unit.

In FIGS. 1 and 2, reference numeral 101 denotes a silicon substrate; 102, photoelectric conversion areas; 103, 105, 107, 110 and 112, low refraction material layers; 104, 106 and 108, wiring layers of metal such as aluminum; and 109 and 111, high refraction material layers. Silicon oxide (SiO2) having an index of refraction of 1.45 and silicon nitride (Si3N4) having an index of refraction of 2.0, both of which have high transmissivity of visible light, are preferable as a material for forming the low refraction material layer and as a material for forming the high refraction material layer, respectively. The high refraction material layer 111 is sandwiched by the low refraction material layers 110 and 112 onto its upper and lower sides and has a rotationally symmetric surface shape that is convex, on both the sides. Thus, the high refraction material layer 111 functions as a microlens having positive power. This serves to collect light from an object into the relatively small photoelectric conversion areas 102 and increase sensitivity of the image pickup element.

Reference numeral 113G denotes a G color filter using an organic pigment, which transmits green light and absorbs red light and blue light. Reference numeral 113R adjacent to 113G denotes an R color filter, which transmits red light and absorbs blue light and green light. Reference numerals 114 and 116 denote resin layers. Both the color filter layers and the resin layers have an index of refraction of approximately 1.50.

Figure 14:
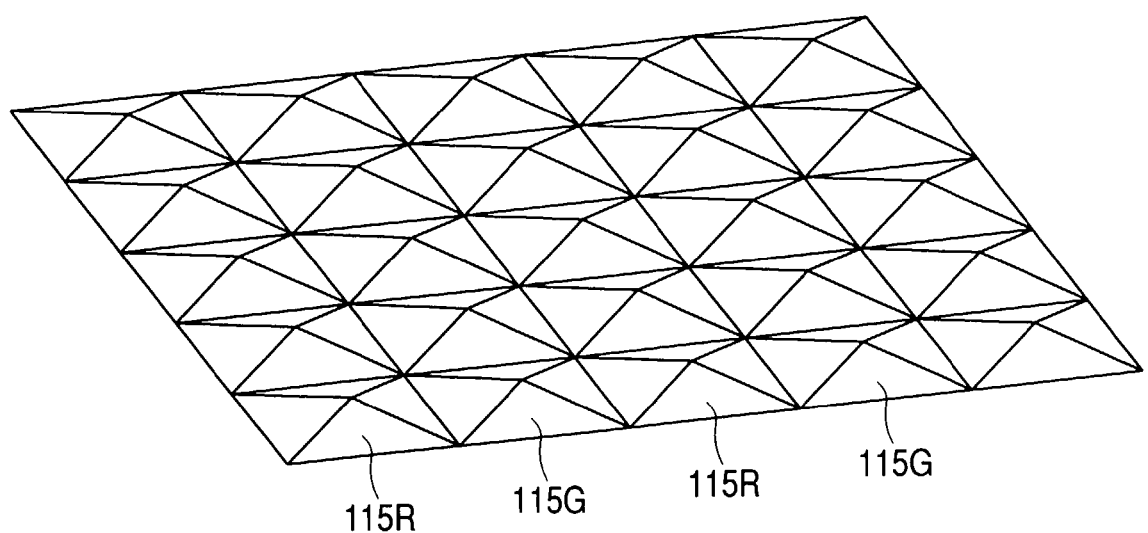
FIG. 14 is a perspective view of an interference filter layer.

Reference numeral 115G denotes an interference filter layer for splitting light, which transmits green light and reflects red light and blue light. Reference numeral 115R adjacent to 115G also denotes an interference filter layer, which transmits red light and reflects blue light and green light. These interference filter layers are formed on slopes of a square pyramid having a vertex in a central part of each pixel as shown in FIG. 14. When a not-shown focusing lens forms an object image on a surface on which the high refraction material layers 111 functioning as microlenses are arranged, the object image becomes a focused image which is an output of the image pickup element.

Note that, in order to facilitate understanding, only a ray 117 is drawn which is emitted from a pupil center of the focusing lens located in a sufficiently distant place with respect to a size of the pixels. Rays emitted from the vicinity of the pupil are incident on the image pickup element with an angle with respect to the ray 117. Then, these rays reach the peripheral parts in the photoelectric conversion areas 102 to be photoelectrically converted there.

Next, behavior of rays for each wavelength will be described with reference to FIG. 2. Object light 118 transmitted through a not-shown infrared ray cut filter comes from the upper part of the figure toward a pixel 120 for receiving green light and is incident on the resin layer 116 first. Next, the object light 118 is incident on the interference filter layer 115G, through which only light of a green component can be transmitted to reach the G color filter 113G from the resin layer 114. Light of a blue component and light of a red component reflected by the interference filter layer 115G are guided to the adjacent pixels. Since this behavior is the same as that of a ray coming into the pixel 120 from an adjacent pixel 121, a description of the pixel 121 will substitute for that of the behavior. In the G color filter 113G, green light that can be transmitted through the interference filter layer 115G has reached there. Thus, most of the green light is transmitted through the G color filter 113G and reaches the high refraction material layer 111 functioning as a microlens through the next low refraction material layer 112. Here, the green light is subjected to a converging action and is radiated to the low refraction material layer 110 and further passes through the high refraction material layer 109 to be incident on the photoelectric conversion area 102. An output from the photoelectric conversion area 102 is inputted to a signal processing circuit discussed later as a green component.

The adjacent pixel 121 is a pixel for receiving red light. Object light 119 transmitted through the not-shown infrared ray cut filter comes to the pixel 121 from the upper part of the figure and is incident on the resin layer 116 first. Next, the object light 119 is incident on the interference filter layer 115R, through which only light of a red component can be transmitted to reach the R color filter 113R from the resin layer 114. A behavior thereafter of the red light is the same as that of the green light in the pixel 120 described above.

Blue light and green light reflected by the interference filter layer 115R advance toward an interface between the resin layer 116 and the air and then are subjected to total internal reflection because an incident angle of the light on the interface becomes equal to or smaller than a critical angle due to an action of a slant that is set in the interference filter layer 115R. The blue light and the green light returned in a direction to the inside of the image pickup element by the total internal reflection are incident on the interference filter layer 115G. Since the interference filter layer 115G is originally a filter provided in the pixel 120 for receiving green light, it transmits green light and reflects blue light. The reflected blue light is not illustrated in the figure because it escapes to the outside of the image pickup element.

As described above, in a light adjustment area including the interference filter layers 115R and 115G and the resin layer 116, green light incident on the interference filter layer 115R is reflected by the interference filter layer 115R and is incident on the interference filter layer 115G and transmitted through it.

The green light component transmitted through the interference filter layer 115G reaches the G color filter 113G through the resin layer 114. In the G color filter 113G, green light that can be transmitted through the interference filter layer 115G has reached there. Thus, most of the green light can be transmitted through the G color filter 113G and reaches the high refraction material layer 111 often functioning as a microlens, through the next low refraction material layer 112.

Rays advance aslant in the high refraction material layer 111 and are reflected on a side of the metal wiring layer 108 before or after radiation to the low refraction material layer 110. In addition, some rays are reflected on the side of the metal wiring layer 108 before being incident on the high refraction material layer 111.

Since an angle of rays coming from the adjacent pixel 121 is obtuse, the rays cannot be incident on the photoelectric conversion area 102 directly through the high refraction material layer 109 but reach the photoelectric conversion area 102 after inevitably being subjected to the total internal reflection on the sides of the metal wiring layers 106 and 104 or the interfaces between the high refraction material layer 109 and the low refraction material layers 107, 105 and 103. The rays are photoelectrically converted in the photoelectric conversion area 102 together with a green component of the object light 118 and are inputted into a signal processing circuit as an output of the pixel 120.

Here, the first embodiment has been described in a relationship between the pixel 120 and the pixel 121. However, if pixels adjacent to each other are not of the same color as in the Bayer array, a wavelength component unnecessary for any optical can be photoelectrically converted as an effective wavelength component of adjacent pixels by dividing the unnecessary wavelength component between the adjacent pixels. Thus, utilization efficiency of light can be significantly improved.

Considering utilization efficiency for each color, this is equivalent to a increase of ratio of R, G and B pixel areas of a color image pickup element of the Bayer array to $\frac{1}{4} \times 2 : \frac{2}{4} \times 2 : \frac{1}{4} \times 2$, when area of a unit constituting a regular array is assumed to be one. Therefore, a utilization ratio of green light when an overall amount of light is one is $\frac{1}{3} \times \frac{4}{4} = \frac{1}{3}$ as a product of a term of wavelength selectivity and a term of an area ratio, and those for red light and blue light are $\frac{1}{3} \times \frac{2}{4} = \frac{1}{6}$, respectively. When these are totaled, $\frac{1}{3} + \frac{1}{6} + \frac{1}{6} = \frac{2}{3}$, which means that the utilization ratio is twice as large as that in the past. Therefore, sensitivity of the image pickup element can be doubled.

Figure 3:
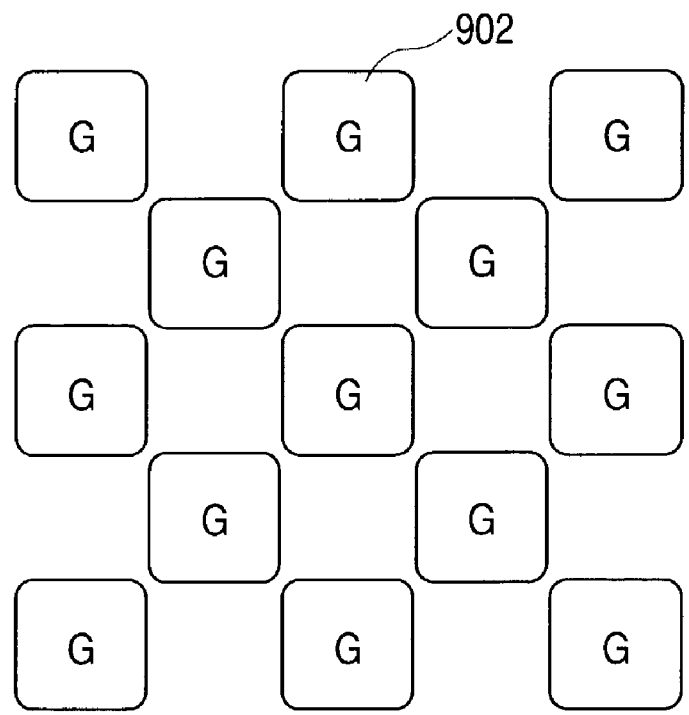
FIG. 3 is a plan view showing openings of conventional G pixels.
Figure 4:
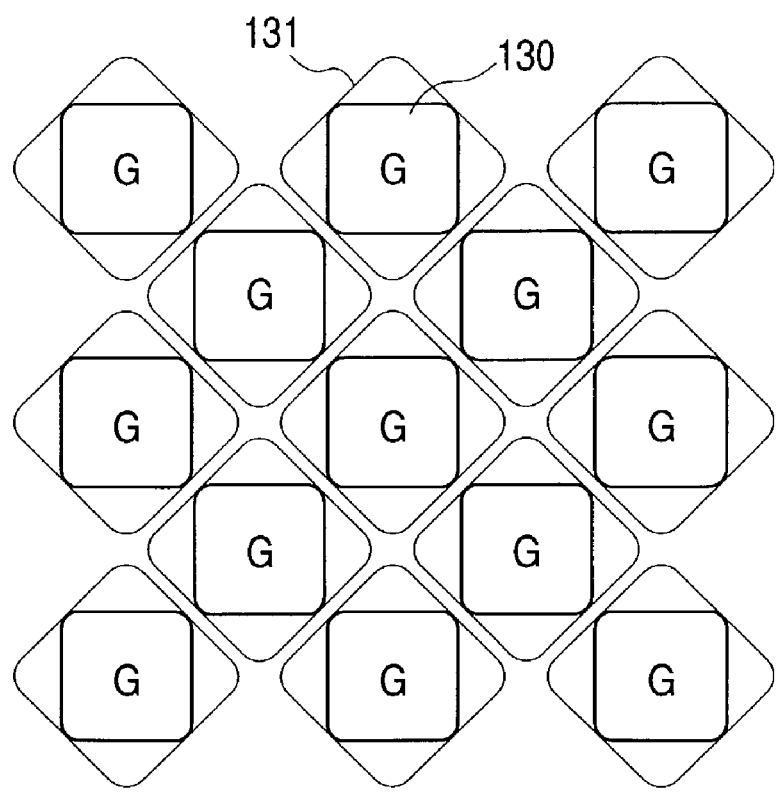
FIG. 4 is a plan view showing openings of G pixels in an image pickup element.
Figure 5:
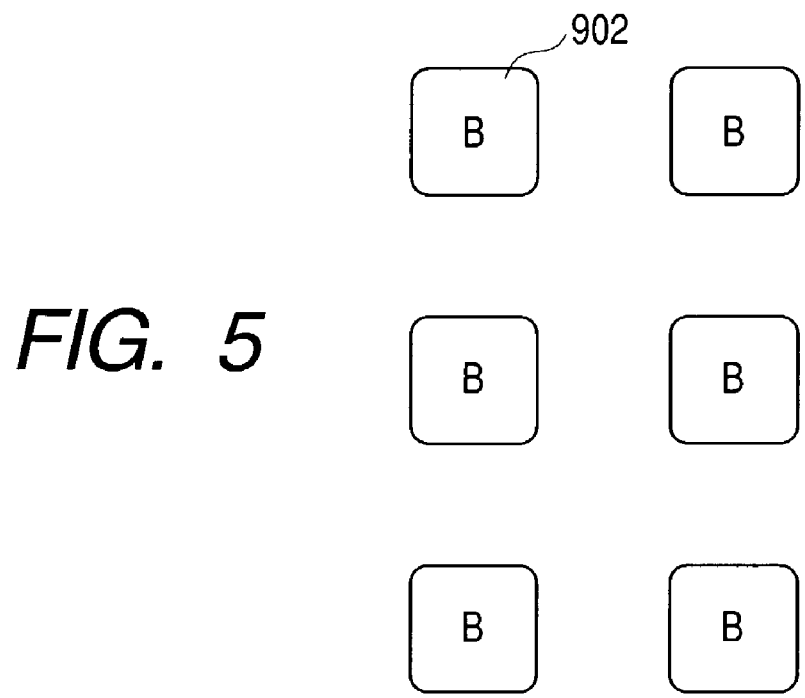
FIG. 5 is a plan view showing openings of conventional B pixels.
Figure 6:
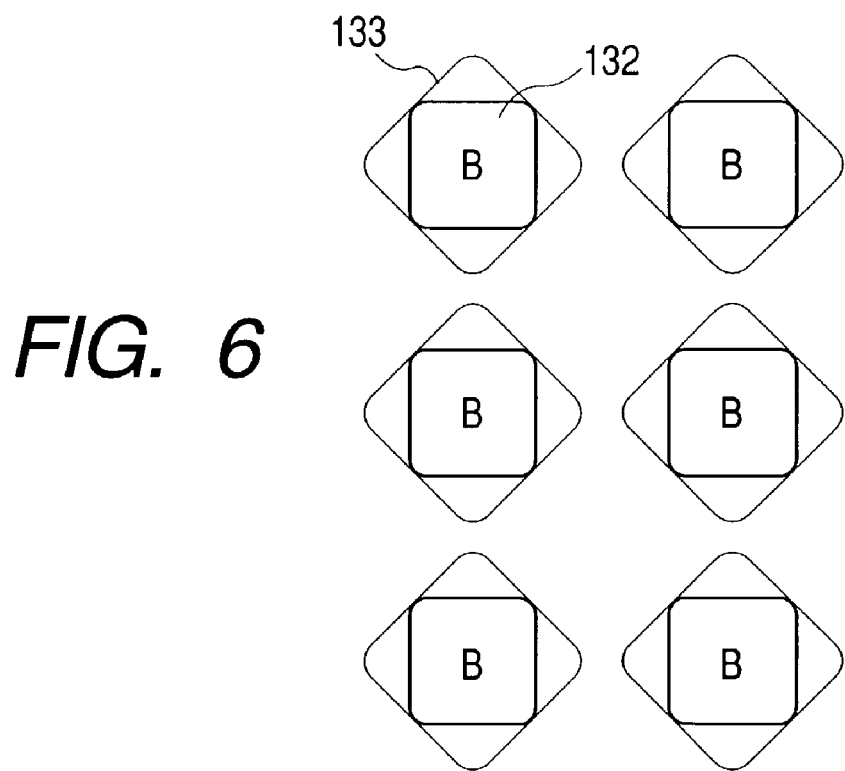
FIG. 6 is a plan view showing openings of B pixels in an image pickup element.
Figure 29:
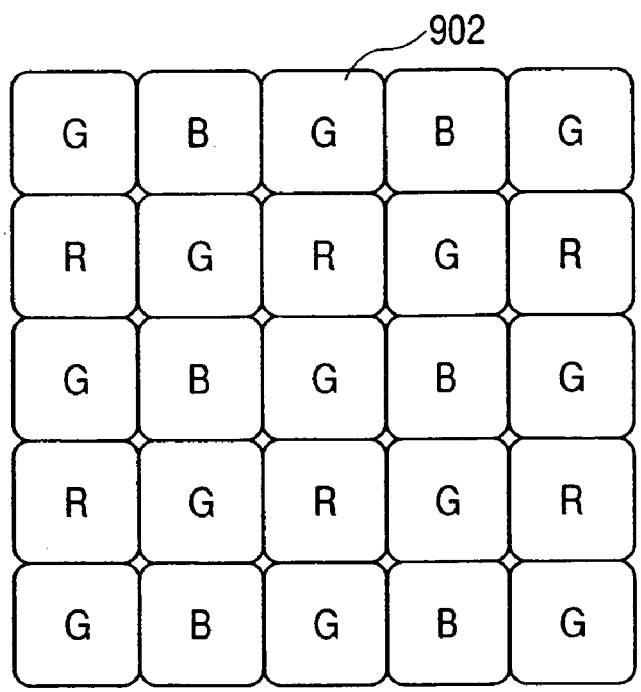
FIG. 29 is a plan view of color image pickup elements of the Bayer array.

In addition, in the image pickup element according to this embodiment, a substantial light receiving opening becomes larger than each pixel. For ease of understanding, when compared with the conventional image pickup element of the Bayer array shown in FIG. 29 for each color of R, G and B, first, the opening of the G pixel is larger than each pixel in the image pickup element of this embodiment shown in FIG. 4, whereas the opening of the conventional G pixel is the size of the microlens 902 as shown in FIG. 3. In FIG. 4, reference numeral 130 denotes microlenses and 131 denotes substantial light receiving openings that take into consideration a green light component spared from adjacent pixels. In the same manner, the opening of the B pixel is larger than each pixel in the image pickup element of the present embodiment as shown in FIG. 6, whereas the opening of the conventional B pixel has the size as shown in FIG. 5. In the figure, reference numeral 132 denotes microlenses and 133 denotes substantial light receiving openings that take into consideration a blue light component spared from adjacent pixels. The R pixel is equivalent to the B pixel. Therefore, when all the pixels are considered by overlapping FIGS. 4 and 6, it is seen that the pixels have light receiving openings that effectively overlap with each other.

In this way, when the substantial light receiving opening becomes larger than each pixel, an MTF characteristic that appears to be impossible in the usual image pickup apparatus of the single plate type can be obtained. As a result, a quality of an image is not deteriorated even if an optical lowpass filter is omitted. That is, it is possible to obtain a high quality image in which aliasing distortion is not conspicuous, only by the third process for photoelectrically converting an object image without the above-mentioned second process for adjusting a high frequency component of a spatial frequency characteristic of the object image to be suppressed.

FIGS. 7 to 13 are graphs explaining the above.

Figure 7:
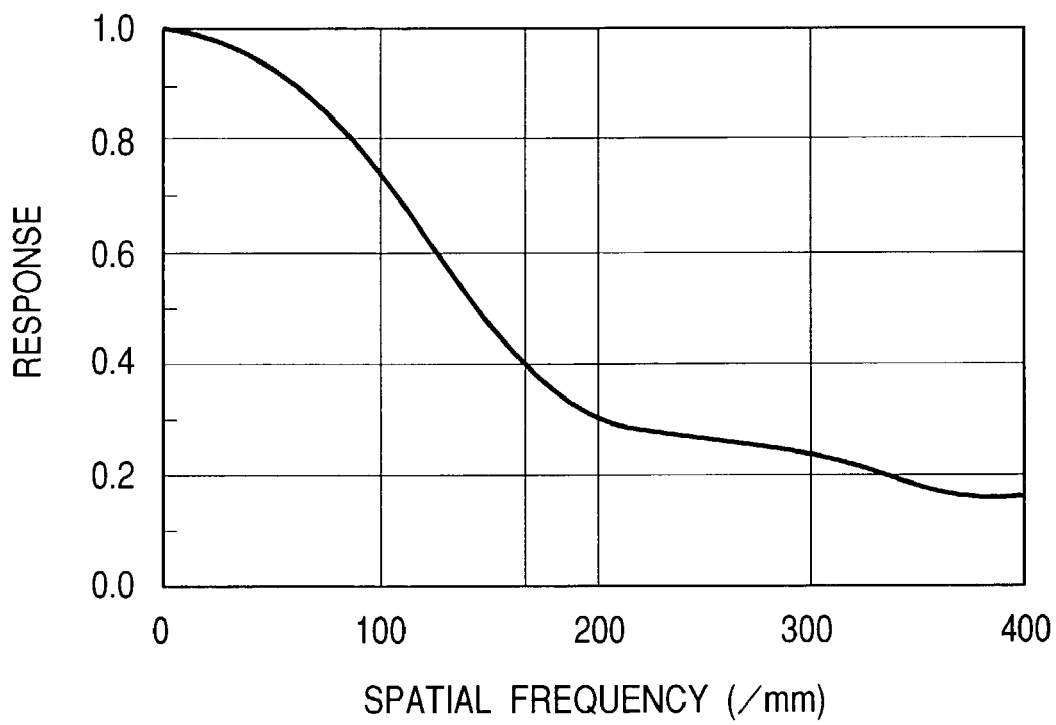
FIG. 7 shows an MTF characteristic with respect to a spatial frequency component in a horizontal direction for pixels 120.
Figure 8:
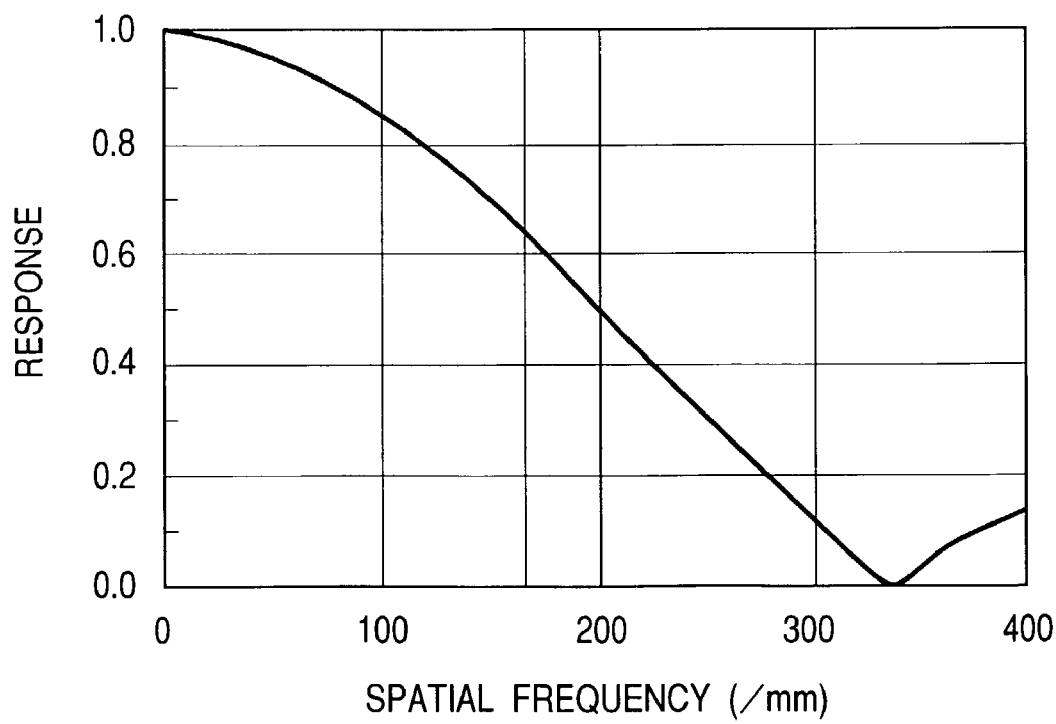
FIG. 8 shows an MTF of a rectangular opening pixel.
Figure 9:
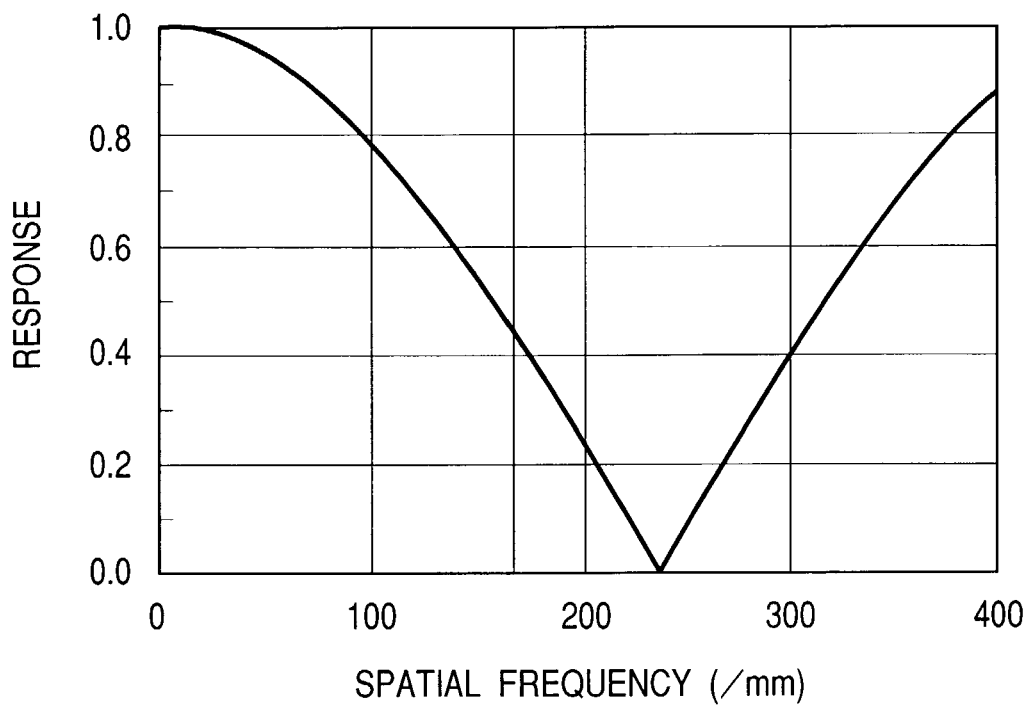
FIG. 9 shows an MTF of an optical lowpass filter.

First, FIG. 7 shows an MTF characteristic with respect to a spatial frequency component in a horizontal direction for the pixel 120 of the image pickup element according to this embodiment. In addition, FIG. 8 shows an MTF characteristic of a pixel having a conventional type of a rectangular opening. In both the cases, a size of one pixel is set as 3 μm×3 μm and a microlens is assumed to have a size of one pixel. Moreover, it is assumed that the pixel of this embodiment has an opening extending to a central part of an adjacent pixel.

Response of the rectangular opening pixel of the conventional type shown in FIG. 8 can be easily represented by an SINC function as in Expression (2) below.

$$R3(u) = |\sin(\pi \cdot d \cdot u)/(\pi \cdot d \cdot u)| \tag{2}$$

where R3(u) is response and d is a width of the light receiving opening of the image pickup element.

A first zero point (cutoff frequency) of Expression (2) is a position of u=1/d. That is, response becomes zero in a wavelength that is the same as the width of the light receiving opening. In the image pickup element in which light receiving openings are arranged without spaces, since the width of the light receiving opening is the same as the pixel pitch, a response value of Expression (2) in the Nyquist frequency u=½d is relatively high at 0.636. Therefore, it is necessary to use the optical lowpass filter of the MTF characteristic shown in FIG. 9 in the conventional rectangular opening pixel.

On the other hand, in the pixel 120 according to this embodiment, response extends to a high frequency wave side due to diamond shaped openings as shown in FIG. 4. This may be considered as gathering of rectangular openings of infinitely thin rectangle shape whose MTF characteristic can be represented by Expression (2). A result of integrating the entire response is as shown in FIG. 7. In the Nyquist frequency 167/mm at the time when the pixel pitch is set at 3 μm, it is seen that the pixel 120 has relatively lower response.

Figure 10:
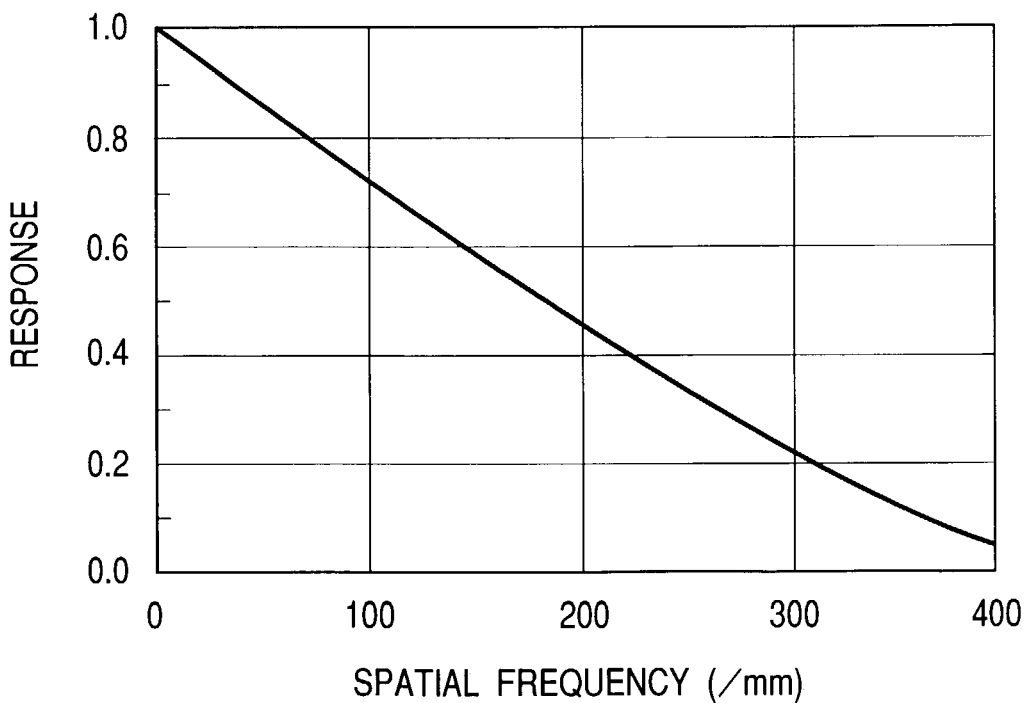
FIG. 10 shows an MTF characteristic of an aplanatic lens at the time when an F number is assumed to be 4.0 and a wavelength of an object image is assumed to be 550 nm.

Next, FIG. 10 shows an MTF characteristic of an aplanatic lens in case of that it is assumed that an F number is 4.0 and a wavelength of an object image is 550 nm. In an ideal lens without aberration in terms of geometrical optics, the MTF depends on diffraction of light. A diffraction limit MTF depends on the F number and is represented by Expression (3) below.

$$R0 = 2 \times (\beta - \cos \beta \times \sin \beta)/\pi\beta = \cos^{-1}(u \cdot F \cdot \lambda) \quad (3)$$

where u is a spatial frequency of an optical image, F is an F number of an optical system and λ is a wavelength of the optical image.

A cutoff frequency of this focusing lens is 455/mm.

Here, all the factors are now prepared to find the overall MTF of the first process for forming an object image by an optical apparatus, (the second process for adjusting a high frequency component of a spatial frequency characteristic of the object image to be suppressed) and the third process for photoelectrically converting the object image whose spatial frequency characteristic is adjusted.

Figure 11:
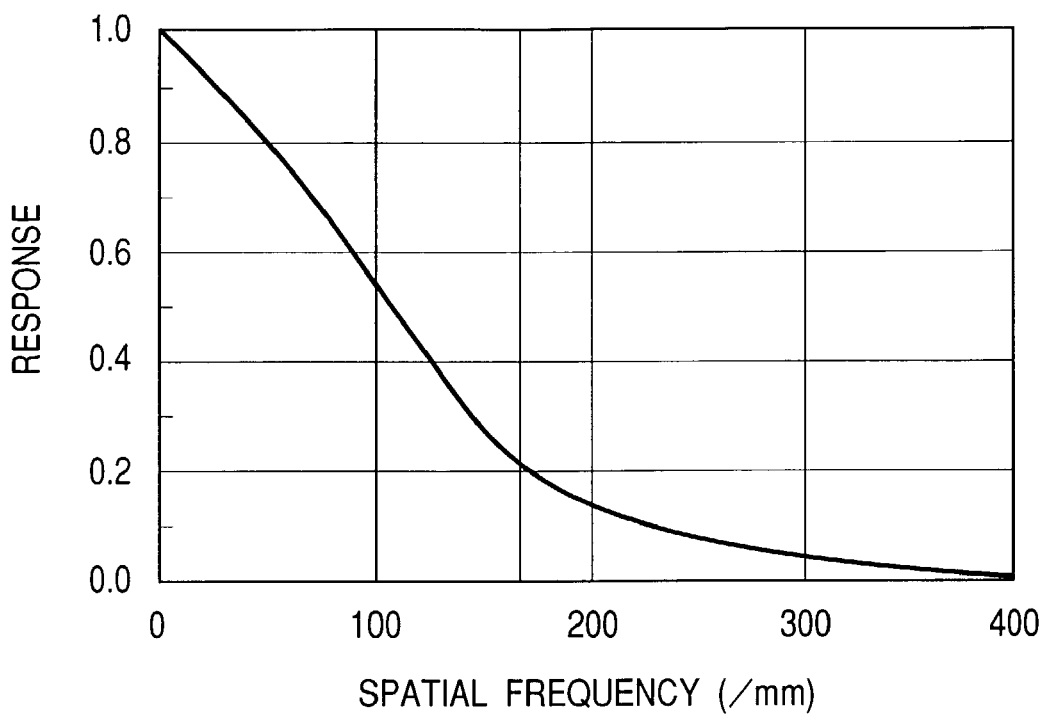
FIG. 11 shows an overall MTF of a focusing lens and pixels of an image pickup element at the time when the pixels 120 are used.
Figure 12:
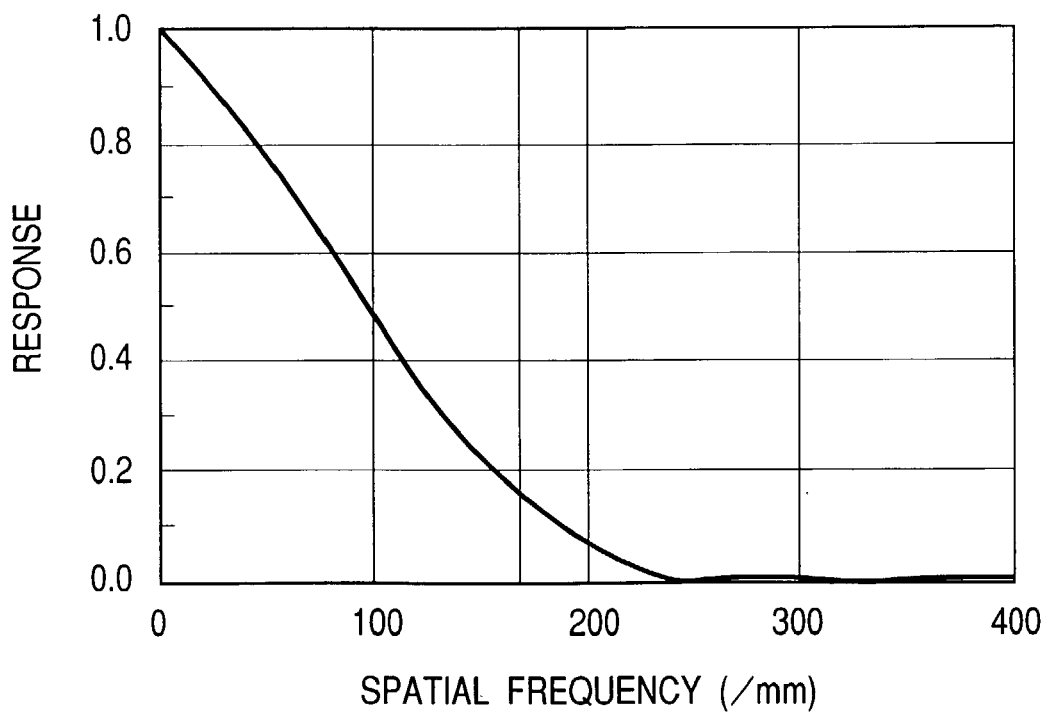
FIG. 12 shows an overall MTF of a focusing lens, an optical lowpass filter and pixels of an image pickup element at the time when conventional pixels are used.
Figure 13:
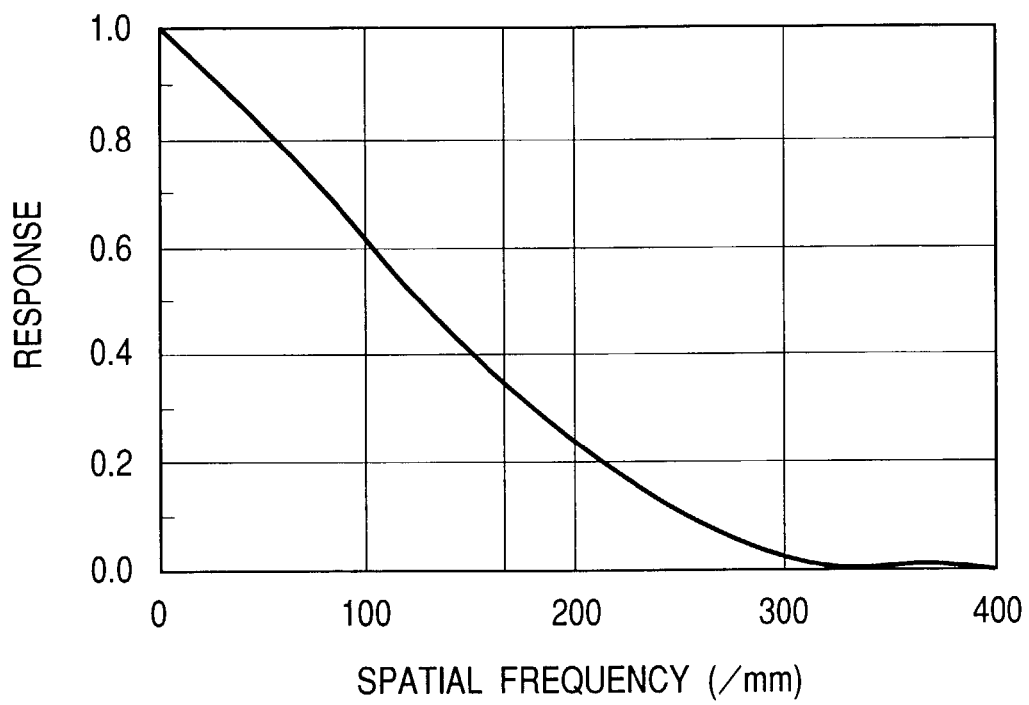
FIG. 13 shows an overall MTF at the time when an optical lowpass filter is not used in the conventional pixels.

FIG. 11 shows an overall MTF of a focusing lens and pixels of an image pickup element when the pixel 120 is used. On the other hand, FIG. 12 shows an overall MTF of a focusing lens, an optical lowpass filter and pixels of an image pickup element, when the conventional pixel is used. Both the overall MTFs have substantially equal response in the Nyquist frequency 167/mm and have very similar characteristics as a whole. On the other hand, if the optical lowpass filter is not used in the conventional pixel, response at the Nyquist frequency becomes too high as shown in FIG. 13. In this way, it is seen that the optical low pass filter can be removed if the pixel 120 is used.

Second Embodiment

Figure 15:
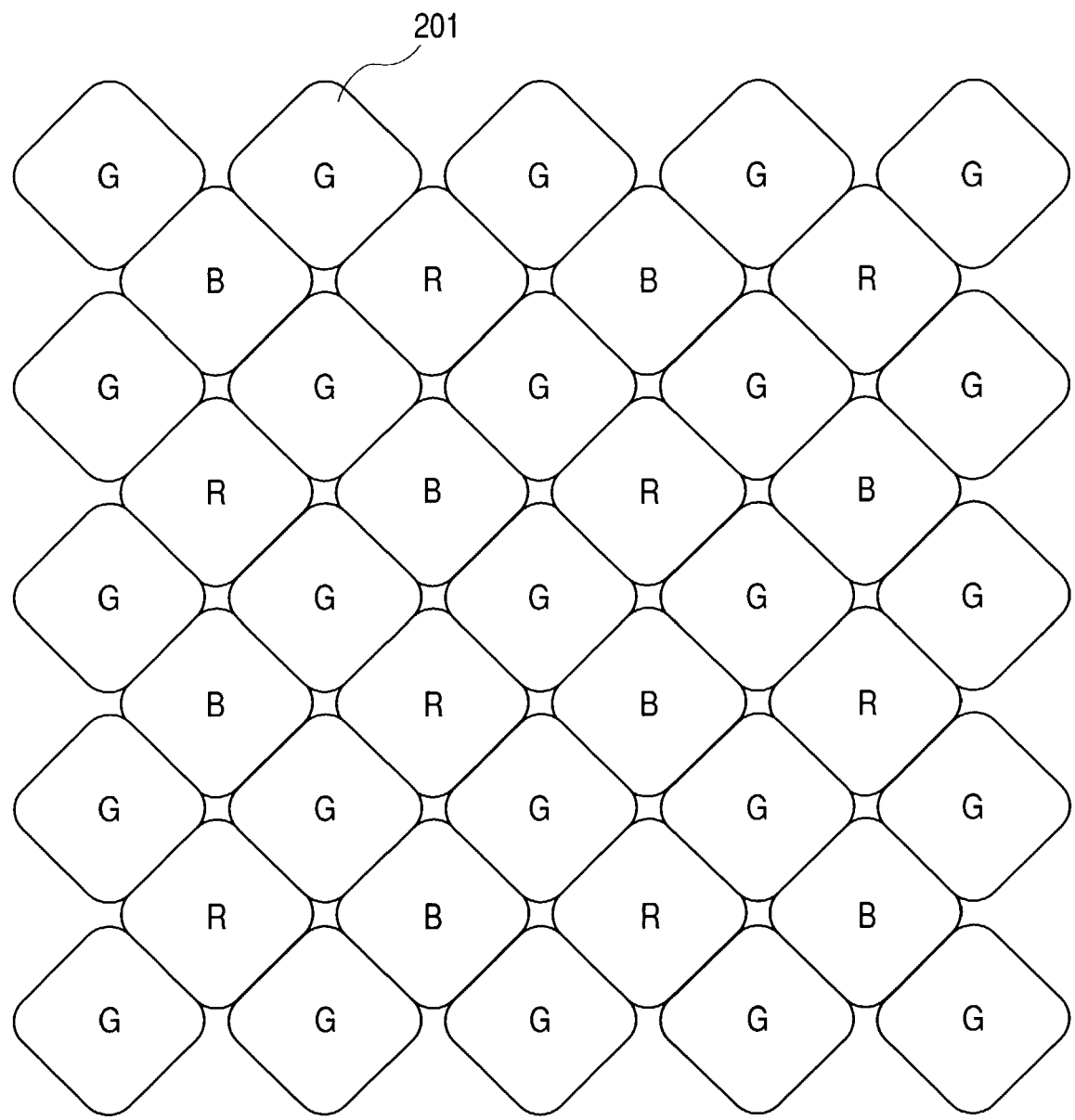
FIG. 15 is a plan view showing an arrangement of pixels and a shape of microlenses.
Figure 16:
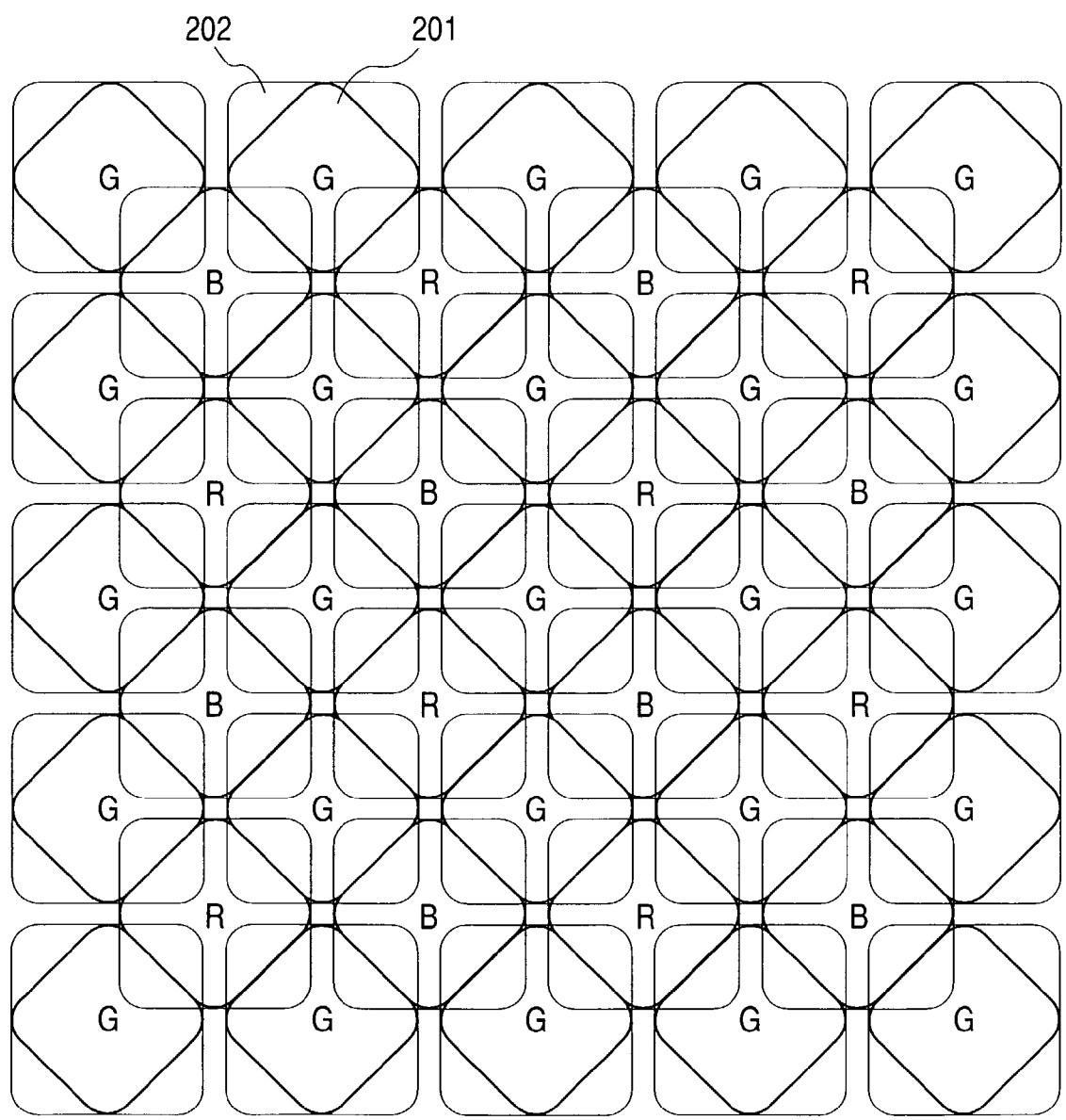
FIG. 16 is a plan view showing an effective light receiving opening of each pixel.

FIGS. 15 and 16 are views for explaining a second embodiment in accordance with the present invention. FIG. 15 is a plan view showing an arrangement of pixels and a shape of microlenses. FIG. 16 is a plan view showing an effective light receiving opening of each pixel.

In these figures, reference numeral 201 denotes microlenses and 202 denotes effective light receiving openings. An arrangement of pixels is 45 degrees rotated from the Bayer array. Therefore, 2×2 R, G, G and B pixel columns are one unit. As disclosed in JP 2000-184386 A, an image pickup element of such an arrangement is preferable for obtaining an image of higher resolution while suppressing increase of the number of pixels.

As shown in FIG. 15, each of the pixel openings constituted by the microlens 201 is a square having four sides slanted in a 45 degree direction and is arranged densely with being in contact with adjacent pixels. This image pickup element also has the structure shown in FIG. 2 as in the first embodiment. Note that, in this case, the cross-section shown in FIG. 2 is that of the pixel of FIG. 15 cut in a diagonal 45 degree direction.

Figure 17:
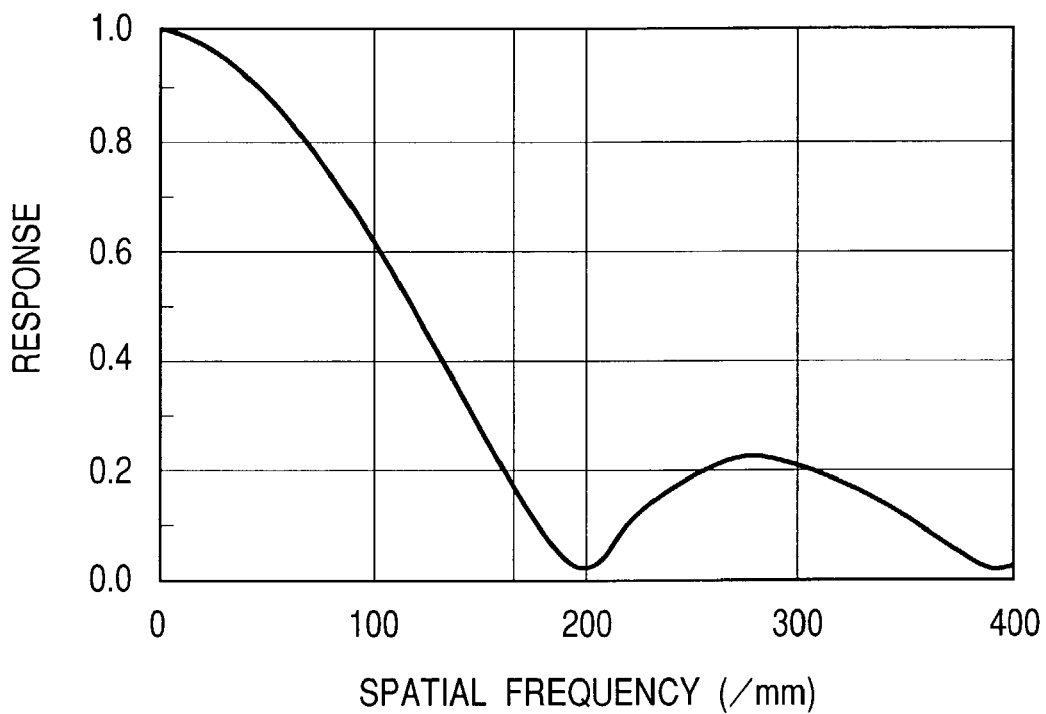
FIG. 17 is an MTF characteristic of a light receiving opening with respect to a spatial frequency component in the horizontal direction.

The effective light receiving opening 202 of such the image pickup element is equivalent to that slanted 45 degrees in FIG. 4 or FIG. 6 and is now a square having four sides in the vertical and horizontal directions. Therefore, Expression (2) is directly applied in order to find an MTF characteristic for a spatial frequency component in the horizontal direction, and the characteristic is as shown in FIG. 17. As indicated by the characteristic of the SINC function, a response curve continues while becoming lower as the frequency becomes higher. A first zero point is near the Nyquist frequency which depends on a pixel pitch in the horizontal direction.

Figure 18:
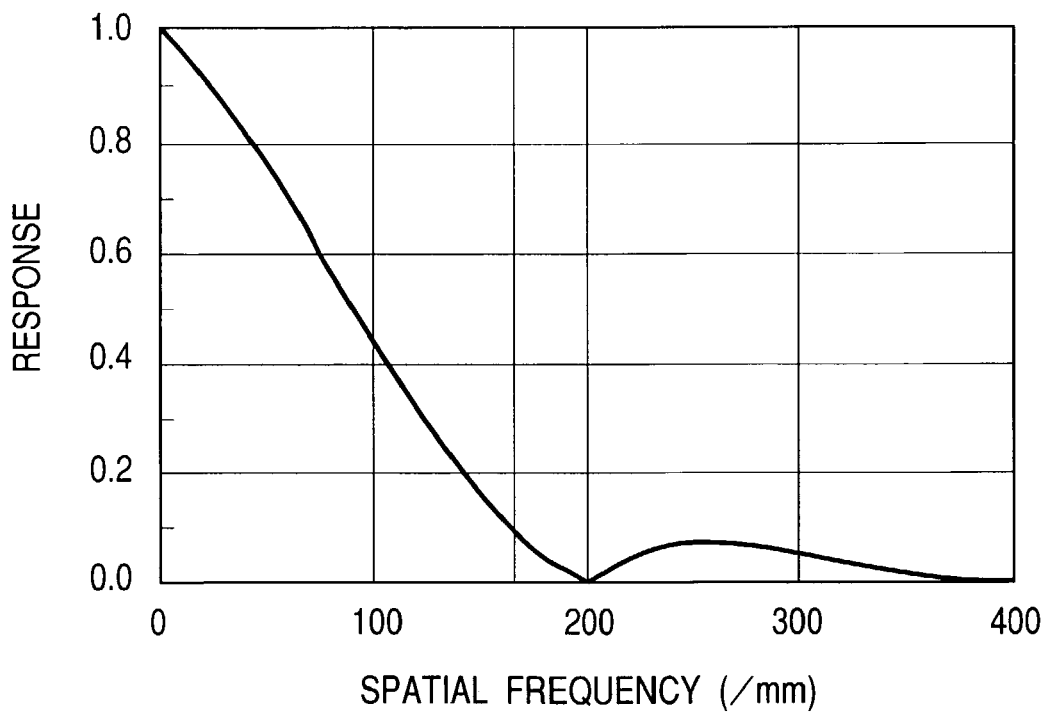
FIG. 18 is an overall MTF of a focusing lens and pixels of an image pickup element.

Moreover, if the MTF characteristic is multiplied by the MTF characteristic of an aplanatic lens when it is assumed that the F number is 4.0 and the wavelength of an object image is 550 nm shown in FIG. 10, an overall MTF of a focusing lens and pixels of an image pickup element is obtained as shown in FIG. 18.

If the overall MTF is compared with an overall MTF of a focusing lens, an optical lowpass filter and pixels of an image pickup element when the conventional pixel shown in FIG. 12 is used, both the overall MTFs have substantially equal response in the Nyquist frequency 167/mm and have very similar characteristics as a whole. In this way, it is seen that the optical low pass filter can be removed.

Third Embodiment

Figure 19:
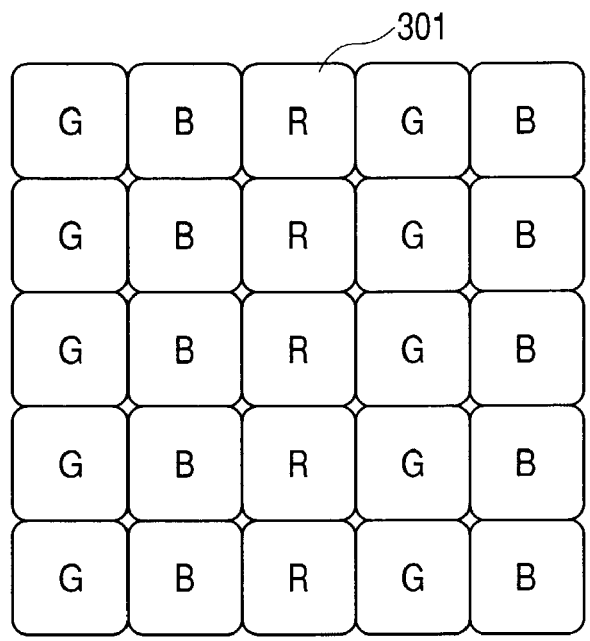
FIG. 19 is a plan view of an image pickup element having R, G and B stripe filters.
Figure 20:
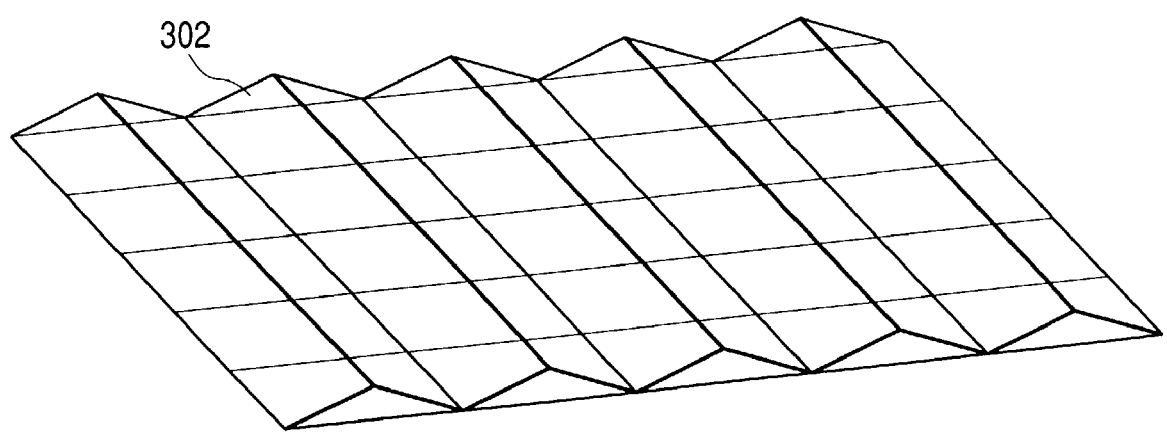
FIG. 20 is a perspective view of an interference filter layer.
Figure 21:
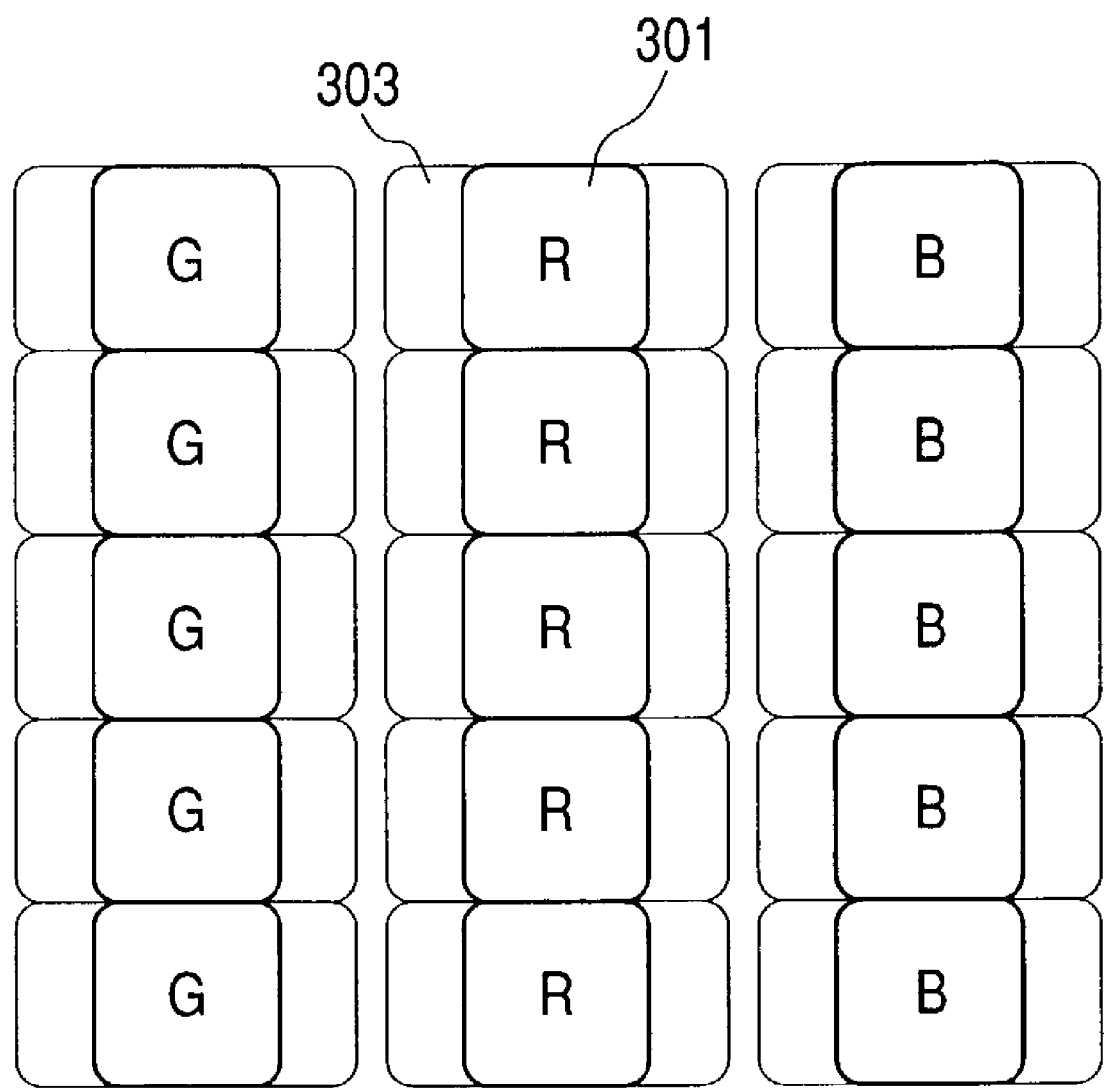
FIG. 21 is a plan view showing effective light receiving openings of pixels.

FIGS. 19 to 21 are views for explaining a third embodiment in accordance with the present invention. FIG. 19 is a plan view of an image pickup element having R, G and B stripe filters 301. FIG. 20 is a perspective view of an interference filter layer. FIG. 21 is a plan view showing an effective light receiving opening of each pixel.

In the image pickup element having the R, G and B stripe filters 301, a lengthwise pixel column having an R filter, a lengthwise pixel column having a G filter and a lengthwise pixel column having a B filter are repeated in sideways. That is, 1×3 R, G and B pixels are one unit having a regular arrangement, and among adjacent four pixels, pixels in the vertical direction are pixels of an identical filter and pixels in the horizontal direction are pixels of different filters. Even in such a structure, the pixel structure shown in the first embodiment is effective in terms of adjusting an MTF of a pixel. However, it is preferable to optimize the structure such that light not photoelectrically converted is exchanged between the adjacent pixels of different filters in terms of increasing a utilization efficiency of light.

Reference numeral 302 in FIG. 20 denotes an interference filter layer for this purpose, which splits light. Here, parts of the structure other than the interference filter are the same as those in the first embodiment.

Interference filters having a plurality of roof type slopes of a stripe shape are arranged, and the interference filters on the two slopes across a ridge are the same type. Moreover, a filter for transmitting red light and reflecting blue light and green light is provided for the lengthwise pixel column having the R filter, a filter for transmitting green light and reflecting blue light and red light is provided for the lengthwise pixel column having the G filter, and a filter for transmitting blue light and reflecting green light and red light is provided for the lengthwise pixel column having the B filter.

An action of the interference filter layer 302 viewed in a cross-section in the direction of arrangement of the R, G and B pixels is the same as the image pickup element shown, in FIG. 2 in the first embodiment. However, light is split only in a paper surface direction of FIG. 2 in this embodiment, while light is split in a front and back direction on the paper surface by the action of the interference filter of a square pyramid shape in the first embodiment. The paper surface direction means a direction of adjacent pixels having different filters.

As a result, effective light receiving openings are as shown in FIG. 21. For ease of understanding, pixel columns are extracted for every other column. In FIG. 21, reference numeral 303 denotes effective light receiving openings. Since light not photoelectrically converted is exchanged between the pixels having the different filters, the opening of each pixel extends sideways as in the figure to overlap an adjacent pixel.

Therefore, a utilization efficiency of light is also improved to be twice as large in this case, and sensitivity is doubled.

Fourth Embodiment

Figure 22:
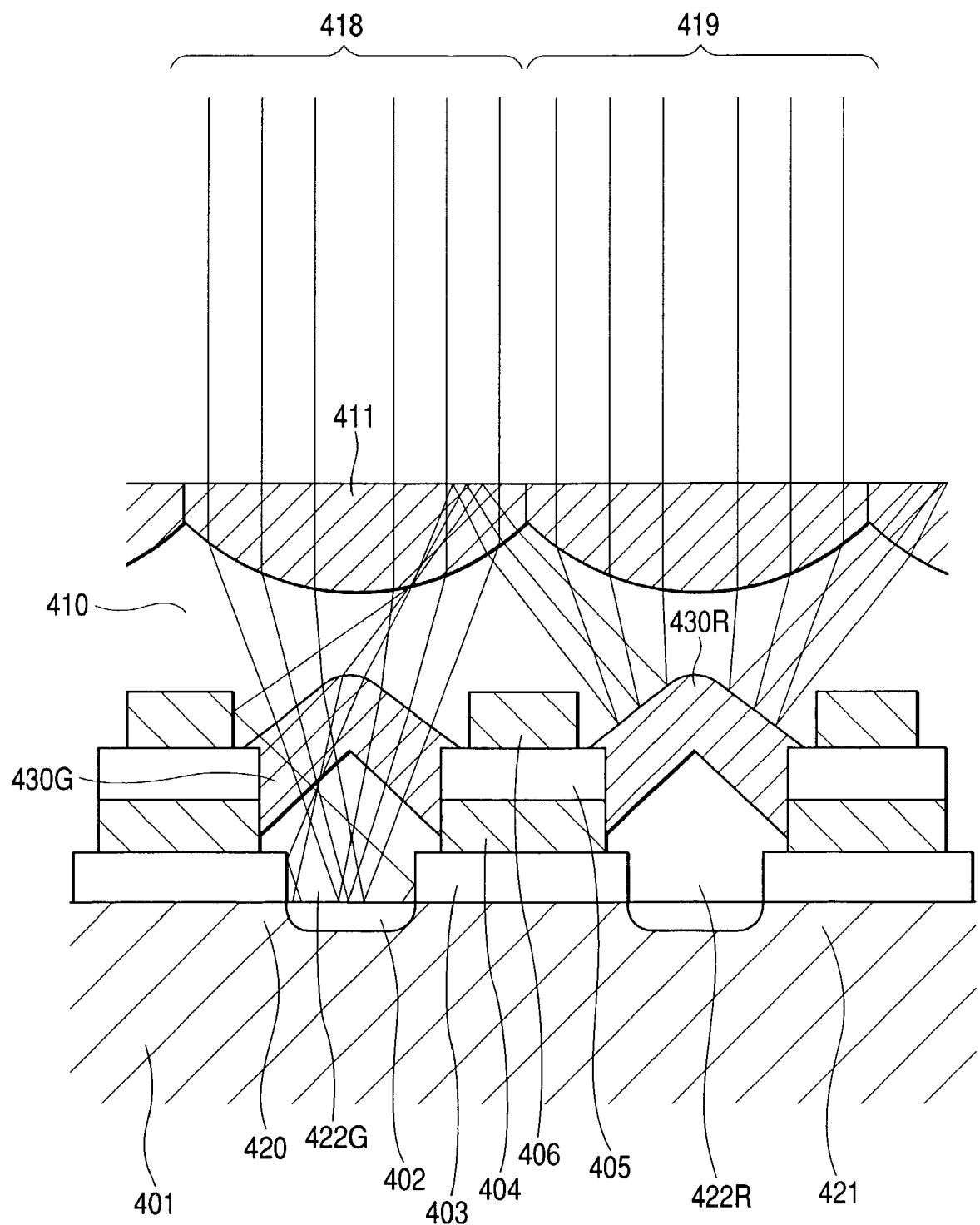
FIG. 22 is a sectional view of an image pickup element.

FIG. 22 is a view for explaining a fourth embodiment in accordance with the present invention and is an enlarged sectional view of an image pickup element. FIG. 22 shows a state in which object light is incident on a pixel column, in which G pixels and R pixels are alternately arranged as in the Bayer array or the like from the upper part of the figure, and reaches photoelectric conversion areas.

In FIG. 22, reference numeral 401 denotes a silicon substrate; 402, photoelectric conversion areas; 403, 405 and 410, low refraction material layers; 404 and 406, wiring layers of metal such as aluminum; and 411, 422G and 422R, high refraction material layers. Silicon oxide (SiO2) having an index of refraction of 1.45 and silicon nitride (Si3N4) having an index of refraction of 2.0, both of which have high transmissivity of visible light, are preferable as a material for forming the low refraction material layer and as a material for forming the high refraction material layer, respectively. The high refraction material layer 411 is sandwiched by the air and the low refraction material layers 410 on its upper and lower sides, respectively, and has an axially symmetric surface shape that is flat on a ray incident side and convex on a ray radiation side. Thus, the high refraction material layer 411 functions as a microlens having positive power. This serves to collect light from an object into the relatively small photoelectric conversion areas 402 and increase sensitivity of the image pickup element. Although not shown in the figure, it is better to attach a reflection preventive film on the light incident surface of the high refraction material layer 411. In addition, reference numerals 430G and 430R denote interference filter layers for splitting light. The interference filter layer 430G transmits green light and reflects red light and blue light. The interference filter layer 430R of the adjacent pixel has a characteristic of transmitting red light and reflecting blue light and green light. These are formed on slopes of a square pyramid having a vertex in the central part of each pixel as in the same manner as the interference filter in the first embodiment shown in FIG. 14.

Note that, in order to facilitate understanding, only rays 418 and 419 are drawn which are emitted from a pupil center of a focusing lens located in a sufficiently distant place with respect to a size of the pixels. Rays emitted from the vicinity of the pupil are incident on the image pickup element with an angle with respect to the rays 418 and 419. Then, these rays reach the peripheral parts in the photoelectric conversion areas 402 to be photoelectrically converted there.

Next, behavior of rays for each wavelength will be described. Object light 418 transmitted through a not-shown infrared ray cut filter comes from the upper part of the figure toward a pixel 420 for receiving green light and is incident first on the low refraction material layer 410 functioning as a microlens. Here, the object light 418 is subjected to a converging action, is radiated to the low refraction material layer 410 and incident on the interference filter layer 430G. Moreover, only a green component can be transmitted through the interference filter layer 430G and reaches the high refraction material layer 422G.

A blue component and a red component reflected by the interference filter layer 430G are guided to the adjacent pixels. Since this behavior is the same as that of a ray coming into the pixel 420 from an adjacent pixel 421, a description of the pixel 421 will substitute for that of the behavior.

In the G color filter 422G, light that can be transmitted through the interference filter layer 430G has reached there. Thus, most of the light is transmitted through the G color filter 422G and incident on the photoelectric conversion area 402. An output from the photoelectric conversion area 402 is inputted into a signal processing circuit as a green component. The adjacent pixel 421 is a pixel for receiving red light. Object light 419 transmitted through a not-shown infrared ray cut filter comes to the pixel 421 from the upper part of the figure and is incident first on the high refraction material layer 411 functioning as a microlens. Here, the red light is subjected to a converging action and is radiated to the low refraction material layer 410 and incident on the interference filter layer 430R. Only a red component can be transmitted through the interference filter layer 430R, and the behavior of the red light thereafter is the same as that of the green light in the pixel 420 described above.

A blue component and a green component reflected by the interference filter layer 430R advance toward the high refraction material layer 411 of the adjacent pixel and then are subjected to total internal reflection because an incident angle of the light on the interface with the air becomes equal to or smaller than a critical angle due to an action of a slant that is set in the interference filter layer 430R. The blue light and the green light returned in a direction to the inside of the image pickup element by the total internal reflection are incident on the interference filter layer 430G. Since the interference filter layer 430G is originally a filter provided in the pixel 420 for receiving green light, it transmits the green component and reflects the blue component in the green light. The reflected blue light is not illustrated here in the figure because it escapes to the outside of the image pickup element.

As described above, in an light adjustment area including the interference filter layers 430R and 430G and the high refraction material layer 411, green light incident on the interference filter layer 430R is incident on the interference filter layer 430G and transmitted through it.

The green light component transmitted through the interference filter layer 430G is reflected on the side of the metal wiring layer 406 before or after incident on the interference filter layer 430G and reaches the photoelectric conversion area 402 through the high refraction material layer 422G. That is, since an angle of rays coming from the adjacent pixel 421 is obtuse, the rays cannot be incident on the photoelectric conversion area 402 directly from the high refraction material layer 411 but reach the photoelectric conversion area 402 with being subjected to the total internal reflection on the sides of the metal wiring layers 406 and 404 or the interfaces between the high refraction material layer 422G and the low refraction material layers 405 and 403. The rays are photoelectrically converted in the photoelectric conversion area 402 together with a green component of the object light 418 and are inputted into a signal processing circuit as an output of the pixel 420.

Here, the fourth embodiment has been described in a relationship between the pixel 420 and the pixel 421. However, if pixels adjacent to each other are not of the same color as in the Bayer array, wavelength component unnecessary for any pixel can be photoelectrically converted as an effective wavelength component of adjacent pixels by dividing the unnecessary wavelength component between the adjacent pixels. Thus, a utilization efficiency of light can be improved to be twice as large. Therefore, sensitivity of the image pickup element can be doubled.

Fifth Embodiment

Figure 23:
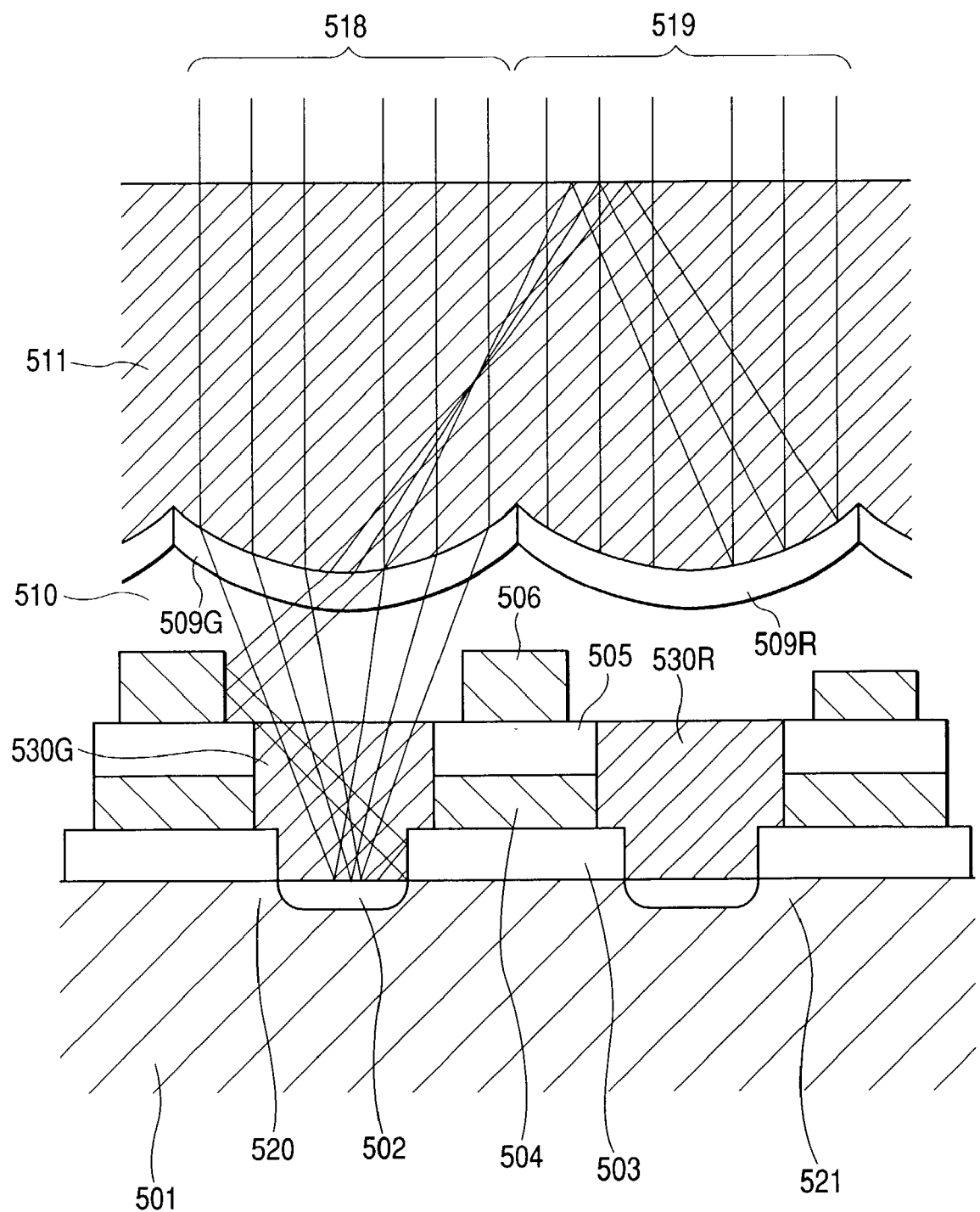
FIG. 23 is a sectional view of the image pickup element.

FIG. 23 is an enlarged sectional view of an image pickup element for explaining a fifth embodiment in accordance with the present invention and shows an example of variation in which the interference filters of the fourth embodiment are arranged along a curved surface of a microlens.

In FIG. 23, reference numeral 501 denotes a silicon substrate; 502, a photoelectric conversion area; 503, 505, 510, 522G and 522R, low refraction material layers; 504 and 506, wiring layers of metal such as aluminum; 511, 522G and 522R, high refraction material layers; and 530G and 530R, color filter layers. The high refraction material layer 511 is sandwiched by the air and the low refraction material layers 510 on its upper and lower sides, respectively, and has an axially symmetric surface shape that is flat on a ray incident side and convex on a ray radiation side. Thus, the high refraction material layer 511 functions as a microlens having positive power. This serves to collect light from an object to the relatively small photoelectric conversion areas 502 and increase a sensitivity of the image pickup element. Although not shown in the figure, it is preferable to attach a reflection preventive film on the light incident surface of the high refraction material layer 511.

In addition, reference numerals 509G and 509R are interference filter layers for splitting light. The interference filter layer 509G transmits green light and reflects red light and blue light. The interference filter layer 509R of the adjacent pixel has a characteristic of transmitting red light and reflecting blue light and green light. These are formed along the curved surface of the high refraction material layer 511.

Note that, in order to facilitate understanding, only rays 518 and 519 are drawn which are emitted from a pupil center of a focusing lens located in a sufficiently distant place with respect to a size of the pixels. Rays emitted from the vicinity of the pupil are incident on the image pickup element with an angle with respect to the rays 518 and 519. Then, these rays reach the peripheral parts in the photoelectric conversion areas 502 to be photoelectrically converted there.

Next, behavior of rays for each wavelength will be described. Object light 518 transmitted through a not-shown infrared ray cut filter comes from the upper part of the figure toward a pixel 520 for receiving green light and is incident first on the high refraction material layer 511 functioning as a microlens. Here, the object light 518 is subjected to a converging action and is radiated to the low refraction material layer 510. Only a green component can be transmitted through the interference filter layer 530G and reaches the photoelectric conversion area 502.

A blue component and a red component reflected by the interference filter layer 530G are guided to the adjacent pixels. Since this behavior is the same as that of a ray coming into the pixel 520 from an adjacent pixel 521, a description of the pixel 421 will substitute for that of the behavior. An output from the photoelectric conversion area 502 is inputted into a signal processing circuit as a green component.

The adjacent pixel 521 is a pixel for receiving red light. Object light 519 transmitted through a not-shown infrared ray cut filter comes to the pixel 521 from the upper part of the figure and is incident first on the high refraction material layer 511 functioning as a microlens. Here, the red light is subjected to a converging action and is radiated to the low refraction material layer 510 through the interference filter layer 530R. Here, only a red component can be transmitted through the interference filter layer 530R, and the behavior of the red light thereafter is the same as that of the green light in the pixel 520 described above. A blue component and a green component reflected by the interference filter layer 530R advance toward the high refraction material layer 511 of the adjacent pixel and then are subjected to total internal reflection because an incident angle of the light on the interface with the air becomes equal to or smaller than a critical angle due to an action of a curvature of the interference filter layer 530R. The blue light and the green light returned in a direction to the inside of the image pickup element by the total internal reflection are incident on the interference filter layer 530G. Since the interference filter layer 530G is originally a filter provided in the pixel 520 for receiving green light, it transmits the green component and reflects the blue component in the green light. The reflected blue light is not illustrated here in the figure because it escapes to the outside of the image pickup element.

As described above, in a light adjustment area including the interference filter layers 509R and 509G and the high refraction material layer 511, green light incident on the interference filter layer 509R is incident on the interference filter layer 509G and transmitted through it.

The green light component transmitted through the interference filter layer 530G is reflected on the side of the metal wiring layer 506 before or after incident on the interference filter layer 530G and reaches the photoelectric conversion area 502 through the color filter layer 530G. The rays are photoelectrically converted in the photoelectric conversion area 502 together with a green component of the object light 518 and are inputted into a signal processing circuit as an output of the pixel 520.

In this way, it is possible to photoelectrically convert an unnecessary wavelength component as an effective wavelength component in an adjacent pixel to improve a utilization ratio of light.

The interference filter layers 115R, 115G, 302, 430R, 430G, 509R and 509G of the first to fifth embodiments described above have the following structure.

Examples of incorporating an interference filter layer in an image pickup element for color division are disclosed in JP 63-269567 A and JP 09-219505 A. The image pickup element comprises silicon nitride (Si3N4) as a high refraction material and silicon oxide (SiO2) as a low refraction material that are alternately laminated as a dielectric body.

Tantalum oxide and zirconium oxide can be used as the high refraction material and magnesium fluoride can be used as the low refraction material.

Here, silicon nitride (Si3N4) is used as the high refraction material and silicon oxide (SiO2) is used as the low refraction material, λ0/4 is set as a base optical thickness (λ0 is a base wavelength) and eleven layers are laminated to obtain reflectivity of approximately 90% at a predetermined base wavelength. The base wavelength is 620 nm in an R pixel, 550 nm in a G pixel and 460 nm in a B pixel. It is sufficient to form silicon nitride (Si3N4) and silicon oxide (SiO2) by a method such as the chemical vapor deposition (CVD) or the electron beam vapor deposition.

Next, the color filters 113R, 113G, 422R, 422G, 530R and 530G of the first to fifth embodiments described above have the following structure.

A rare-earth metal ion for cutting off an intermediate wavelength of R, G and B light is dispersed in the color filters. This is because a wavelength region to be divided shifts by a change in an incident angle of a ray in an interference filter layer. Therefore, a wavelength region reaching a photoelectric-conversion area through the color filters becomes a transmitted wavelength region that is slightly narrower than a transmitted wavelength region of the interference filter.

As the rare-earth metal ion, there are one or two types such as a neodymium ion, a praseodymium ion, an erbium ion and a holmium ion. It is preferable to use at least the neodymium ion as an essential ion. Note that trivalent ion is usually used as these ions.

In addition, it is possible to change the interference filter layer to a photonic crystal layer and give it the same characteristics as the color filters. In this case, if a photonic band gap structure is adopted such that a photonic band gap (PBG) phenomenon occurs, the transmitted wavelength region does not shift depending on the incident angle of light. The technique disclosed in JP 2000-009955 A can be applied for manufacture of a photonic crystal. In this case, it is no longer necessary to disperse the rare-earth metal ion for cutting off the intermediate wavelength of the R, G and B light in the color filters.

Note that, although reflection is used as a method of splitting light in the above-description, refraction may be used as well. In recent years, "super prism effect" for changing a refraction angle extremely sensitive to a wavelength of light utilizing a wavelength dispersity has been reported (H. Kosaka et al., "Super prism phenomena in photonic crystals", Physical Review B, vol. 58, no. 16, p. R10096, 1998). An effect of a curving angle having remarkable wavelength dependency when a beam of light or a wave flux crosses a boundary from an inside to an outside of a photonic crystal in which materials with different indexes of refraction are arranged periodically or in the opposite direction is called the super prism effect. If this effect is utilized, it is possible to deflect a specific wavelength component in a direction of adjacent pixels. Note that the method disclosed in JP 2000-232258 A can be used for manufacturing a semiconductor photonic crystal.

Here, in the first to fifth embodiments, the image pickup element may not be provided with any color filter, although a quality of an image of the image pickup element is lower than the above-mentioned case.

In addition, the image pickup element of the first to fifth embodiments may be an image pickup element of a CCD type or may be an image pickup element of an XY address type such as a CMOS image sensor.

Sixth Embodiment

An embodiment in which any one of the image pickup elements of the first to fifth embodiments is applied to an image pickup apparatus (still camera) will be described in detail with reference to FIG. 24.

Figure 24:
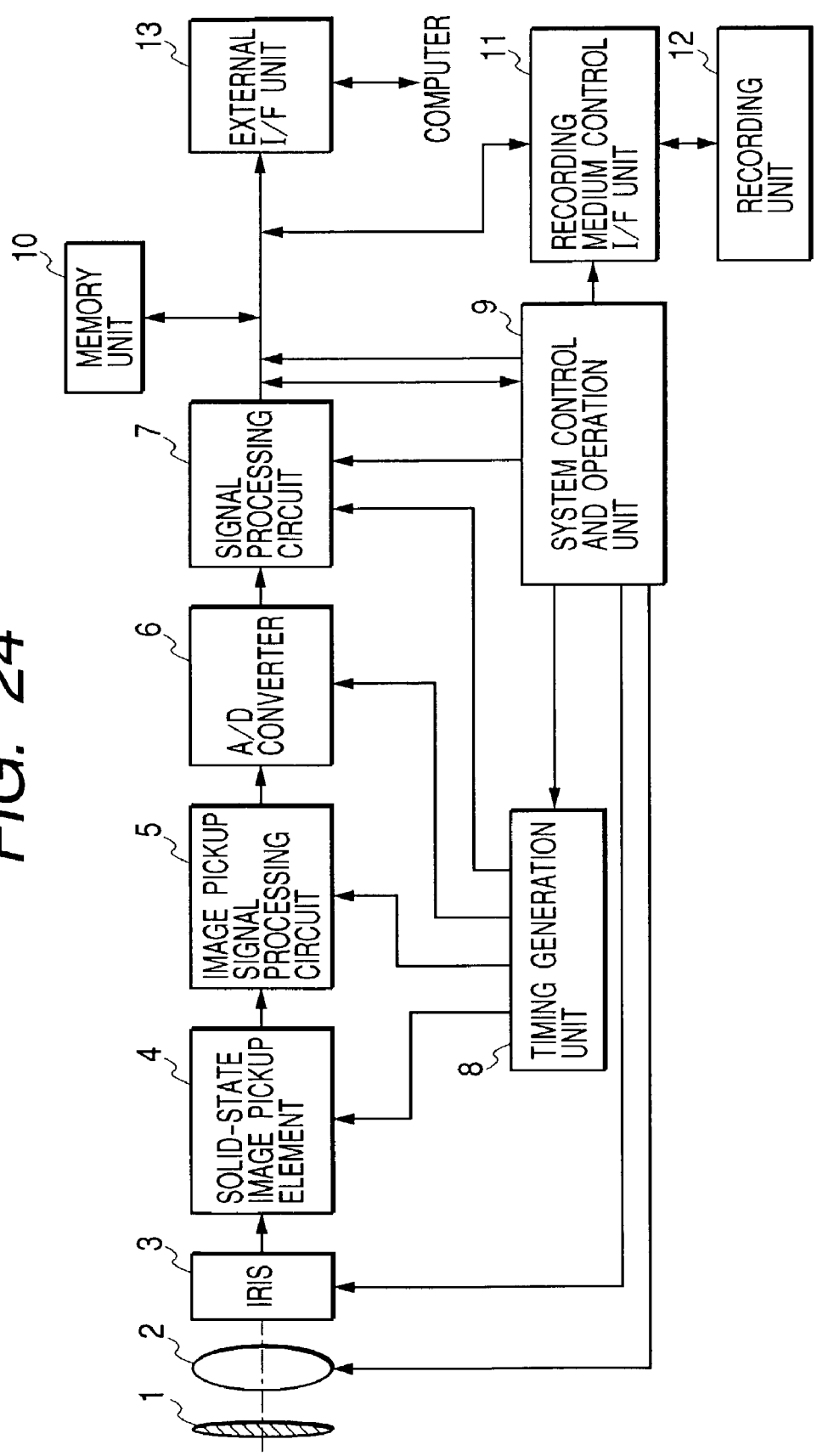
FIG. 24 is a block diagram showing an image pickup apparatus.
Figure 25:
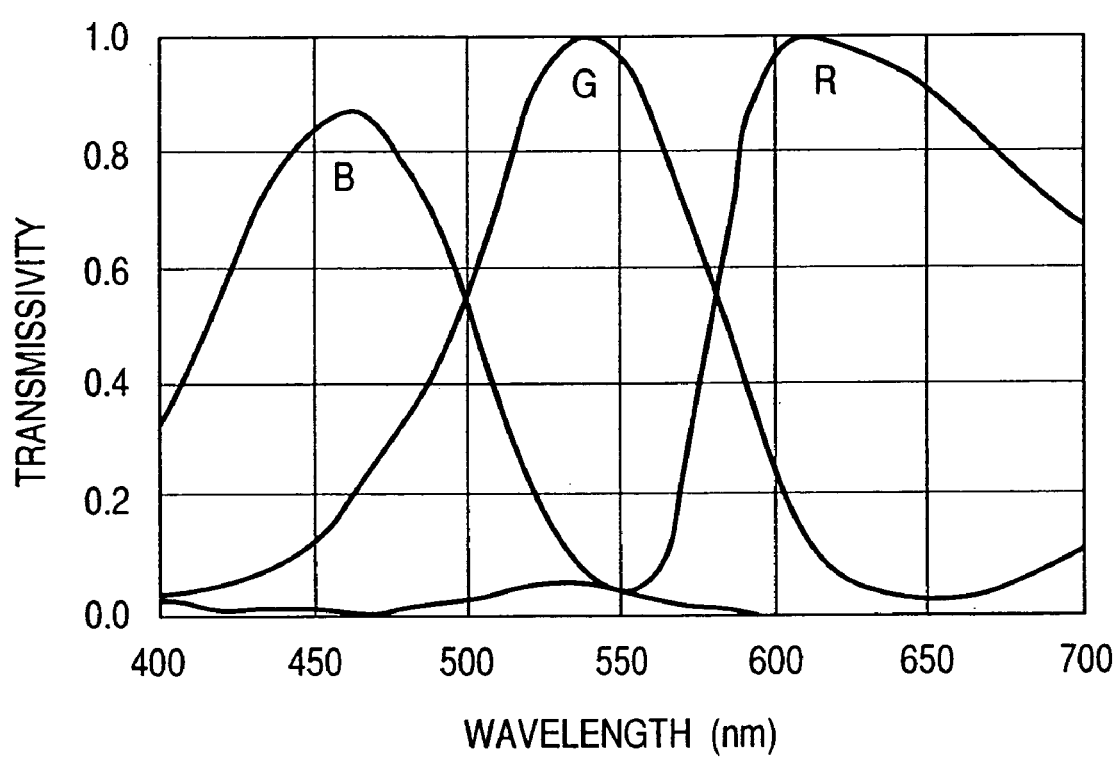
FIG. 25 shows spectral transmissivity characteristics of R, G and B color filters.
Figure 26:
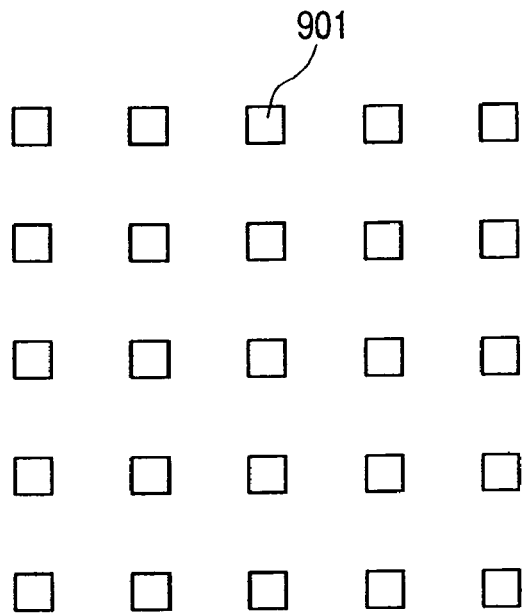
FIG. 26 is a plan view showing an arrangement of photoelectric conversion areas on an image pickup element.
Figure 27:
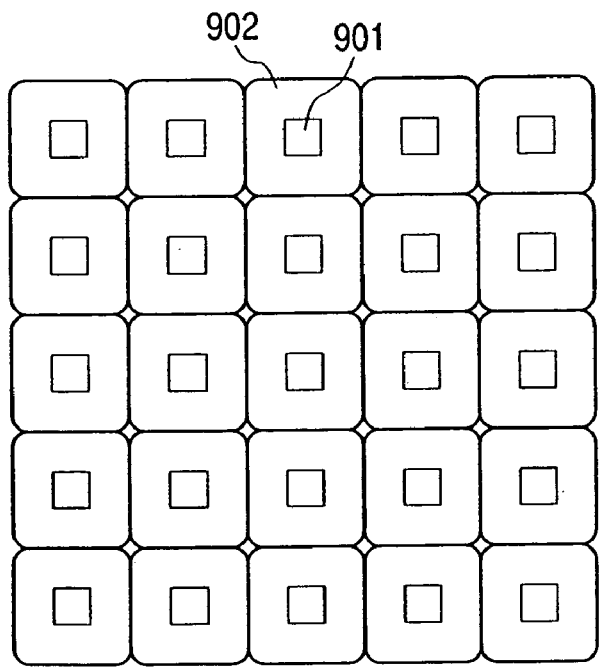
FIG. 27 is a plan view showing an arrangement of microlenses on an image pickup element.
Figure 28:
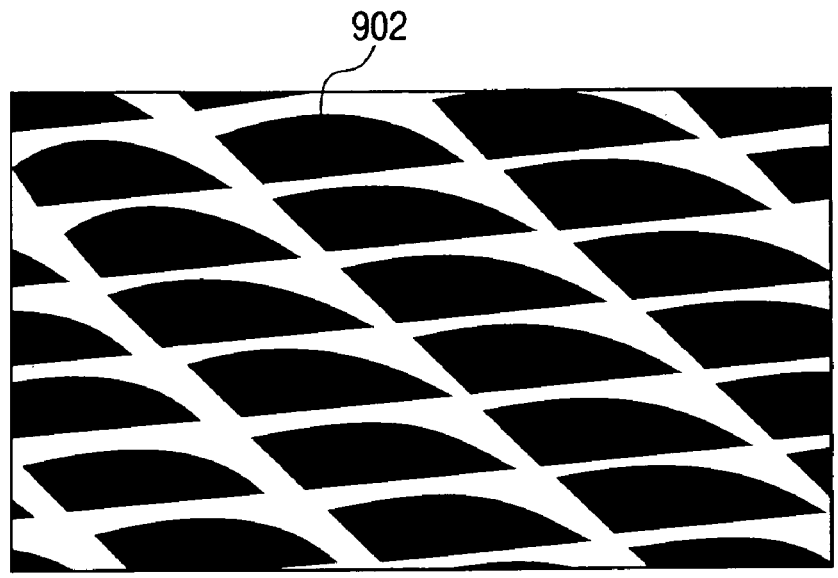
FIG. 28 is a perspective view of a microlens 902.

In FIG. 24, reference numeral 1 denotes a barrier functioning both as a protect of a lens and a main switch; 2, a lens for focusing an optical image of a subject on an image pickup element 4; 3, an iris for varying an amount of light that has passed through the lens 2; 4, an image pickup element for capturing the subject image focused by the lens 2 as an image signal; 5, an image pickup signal processing circuit for processing an image pickup signal; 6, an A/D converter for performing analog/digital conversion of the image signal outputted from the image pickup element 4; 7, a signal processing circuit for applying various kinds of correction to image data outputted from the A/D converter 6 or compressing the data; 8, a timing generation unit for outputting various timing signals to the image pickup element 4, the image pickup signal processing circuit 5, the A/D converter 6 and the signal processing circuit 7; 9, a system control and operation unit for controlling various arithmetic operations and the entire still video camera; 10, a memory unit for temporarily storing image data; 11, an interface unit for recording data in and reading data from a recording medium; 12, a detachably attachable recording medium such as a semiconductor memory for recording or reading out image data; and 13, an interface unit for communicating with an external computer and the like.

Next, operations of the image pickup apparatus at the time of photographing in the above-mentioned configuration will be described.

When the barrier 1 is opened, a main power supply is turned on, a power supply of a control system is turned on next, and a power supply of an image pickup system circuit such as the A/D converter 6 is turned on. Then, the system control and operation unit 9 opens the iris 3 in order to control an amount of exposure. A signal outputted from the solid-state image pickup element 4 is converted in the A/D converter 6 and then inputted into the signal processing circuit 7. Arithmetic operation of exposure is performed in the system control and operation unit 9 based on the data. Brightness is judged according to a result of performing this photometry, and the system control and operation unit 9 controls the iris 3 according to the result.

Next, a high frequency component is extracted and arithmetic operation of a distance to an object is performed in the system control and operation unit 9 based on the signal outputted from the image pickup element 4. Thereafter, the lens 2 is driven to judge whether or not the lens 2 is focused and, if it is judged that the lens 2 is not focused, the lens 2 is driven again to perform distance measurement. Then, after focusing is confirmed, main exposure is started.

When the exposure ends, the image signal outputted from the image pickup element 4 is A/D converted by the A/D converter 6, passes through the signal processing circuit 7 and is written in the memory unit 10 by the system control and operation unit 9. Thereafter, the data stored in the memory unit 10 passes through the recording medium control I/F unit 11 and is recorded in the detachably attachable recording medium 12 such as a semiconductor memory by the control of the system control and operation unit 9. In addition, the data may be directly inputted into a computer or the like through the external I/F unit 13 to process an image.

As described above, in the image pickup element in which a plurality of pixels are arranged regularly, at least two pixels in one unit constituting the regular arrangement have light splitting means for forming light receiving openings effectively overlapping each other, respectively. Thus, an image pickup apparatus that obtains a high grade image with less moiré without requiring an expensive optical lowpass filter can be realized.

In addition, since a plurality of pixels having different spectral sensitivity characteristics are arranged regularly in the image pickup element, a utilization ratio of incident light and sensitivity of the image pickup element can be increased. As a result, it has become possible to easily photograph a darker object. When this image pickup element is applied to a digital camera or the like, since a fast shutter speed can be selected, failure of photographing due to hand vibration can be reduced.

Many widely different embodiments of the present invention may be constructed without departing from the spirit and scope of the present invention. It should be understood that the present invention is not limited to the specific embodiments described in the specification except as defined in the appended claims.

What is claimed is:

1. An image pickup apparatus comprising:
   a plurality of pixel units formed in a single image pickup element,
   wherein each of said plurality of pixel units comprises a photoelectric conversion area, a light incident portion for causing light to be incident on said photoelectric conversion area, and an incident light adjustment portion for causing light incident on said light incident portion once to be incident on an adjacent light incident portion,
   a first filter that is provided in said light incident portion and transmits light of a first wavelength range; and
   a second filter that is provided in said adjacent light incident portion and transmits light of a second wavelength range different from the first wavelength range,
   wherein said incident light adjustment portion causes the light of the second wavelength range incident on said light incident portion once to be incident on said adjacent light incident portion.

2. An image pickup apparatus according to claim 1,
   wherein said first filter reflects the light of the second wavelength range.

3. An image pickup apparatus according to claim 2, further comprising a third filter for absorbing the light of the second wavelength range and transmitting the light of the first wavelength range between said first filter and the photoelectric conversion area.

4. An image pickup apparatus according to claim 2, wherein a shape of said light incident portion is a square pyramid.

5. An image pickup apparatus according to claim 2, wherein a shape of said light incident portion is concave.

6. An image pickup apparatus according to claim 1,
   wherein a shape of said light incident portion slants from a central area to a peripheral area of said light incident portion.

7. An image pickup apparatus according to claim 1, further comprising:
   an analog/digital conversion circuit, arranged to convert an analog signal outputted from said photoelectric conversion area of each of said plurality of pixel units into a digital signal;
   a digital signal processing circuit, arranged to process the digital signal converted by said analog/digital conversion circuit; and
   a memory circuit, arranged to store the digital signal processed by said digital signal processing circuit.

* * * * *

UNITED STATES PATENT AND TRADEMARK OFFICE
CERTIFICATE OF CORRECTION

| | |
|---|---|
| PATENT NO. | : 7,110,034 B2 |
| APPLICATION NO. | : 10/227385 |
| DATED | : September 19, 2006 |
| INVENTOR(S) | : Suda |

It is certified that error appears in the above-identified patent and that said Letters Patent is hereby corrected as shown below:

<u>ON THE TITLE PAGE, AT ITEM (57), Abstract</u>:
Line 5, "photoelectic" should read --photoelectric--.

<u>COLUMN 1</u>:
Line 17, "generates" should read --generate--.
Line 59, "an" (second occurrence) should read --a--.

<u>COLUMN 2</u>:
Line 31, "without" should read --without spaces, since the width--.
Line 56, "Rs(u)" should read --R2(u)--.

<u>COLUMN 5</u>:
Line 61, "pixels" (second occurrence) should read --pixel--.

<u>COLUMN 8</u>:
Line 2, "a" should read --an--.

<u>COLUMN 9</u>:
Line 30:

$$\text{``}R0 = 2x(\beta - \cos \beta x \sin \beta)/\pi\beta = \cos^{-1}(u \cdot F \cdot \lambda)\text{''}$$

should read $$\text{--}R0 = 2 \ x \ (\beta - \cos \beta \ x \ \sin \beta)/\pi$$
$$\beta = \cos^{-1}(u \cdot F \cdot \lambda)\text{--}.$$

Line 52, "low pass" should read --lowpass--.

<u>COLUMN 10</u>:
Line 36, "low pass" should read --lowpass--.

<u>COLUMN 11</u>:
Line 10, "shown,in" should read --shown in--.

<u>COLUMN 12</u>:
Line 59, "an" should read --a--.

UNITED STATES PATENT AND TRADEMARK OFFICE
CERTIFICATE OF CORRECTION

PATENT NO. : 7,110,034 B2
APPLICATION NO. : 10/227385
DATED : September 19, 2006
INVENTOR(S) : Suda It is certified that error appears in the above-identified patent and that said Letters Patent is hereby corrected as shown below:

COLUMN 13:
Line 33, "505," should read --505 and--.
Line 34, "522G and 522R," should be deleted.

COLUMN 14:
Line 11, "pixel 421" should read --pixel 521--.

COLUMN 15:
Line 22, "photoelectric-conversion" should read --photoelectric conversion--.
Line 44, "above-description," should read --above description,--.

COLUMN 17:
Line 34, "portion," should read --portion;--.

Signed and Sealed this

First Day of July, 2008

JON W. DUDAS
*Director of the United States Patent and Trademark Office*